US011283304B2

(12) United States Patent
Duche et al.

(10) Patent No.: US 11,283,304 B2
(45) Date of Patent: Mar. 22, 2022

(54) PLASMONIC RECTENNA DEVICE AND METHOD OF MANUFACTURING

(71) Applicants: UNIVERSITE D'AIX-MARSEILLE, Marseilles (FR); CENTRE NATIONAL DE LA RECHERCHE SCIENTIFIQUE, Paris (FR); ECOLE CENTRALE DE MARSEILLE, Marseilles (FR); UNIVERSITE DE TOULON, LA Garde (FR)

(72) Inventors: David Duche, Marseilles (FR); Ludovic Escoubas, Marseilles (FR); Ujwol Palanchoke, Saint Joseph de Riviere (FR); Jean-Jacques Simon, Peypin (FR); Teodor Silvius Balaban, Marseilles (FR)

(73) Assignees: UNIVERSITE D'AIX-MARSEILLE, Marseilles (FR); CENTRE NATIONAL DE LA RECHERCHE SCIENTIFIQUE, Paris (FR); ECOLE CENTRALE DE MARSEILLE, Marseilles (FR); UNIVERSITE DE TOULON, La Garde (FR)

( * ) Notice: Subject to any disclaimer, the term of this patent is extended or adjusted under 35 U.S.C. 154(b) by 0 days.

(21) Appl. No.: 16/762,126

(22) PCT Filed: Nov. 28, 2018

(86) PCT No.: PCT/EP2018/082797
§ 371 (c)(1),
(2) Date: May 6, 2020

(87) PCT Pub. No.: WO2019/110384
PCT Pub. Date: Jun. 13, 2019

(65) Prior Publication Data
US 2020/0358321 A1  Nov. 12, 2020

(30) Foreign Application Priority Data

Dec. 4, 2017 (EP) .................................. 17306695

(51) Int. Cl.
*H02J 50/27* (2016.01)
*G02B 6/122* (2006.01)
*H02J 50/30* (2016.01)
*H01Q 1/24* (2006.01)
*H01L 31/0232* (2014.01)

(52) U.S. Cl.
CPC ............ *H02J 50/27* (2016.02); *H01Q 1/248* (2013.01); *H02J 50/30* (2016.02); *G02B 6/1226* (2013.01); *H01L 31/02322* (2013.01)

(58) Field of Classification Search
None
See application file for complete search history.

(56) References Cited

U.S. PATENT DOCUMENTS 3,760,257 A    9/1973  Fletcher
8,115,683 B1   2/2012  Stefanakos et al.
(Continued)

FOREIGN PATENT DOCUMENTS

WO  2008/150295 A2  12/2008
WO  2009/023778 A1   2/2009
WO  2016/202995 A1  12/2016

OTHER PUBLICATIONS

Grover, et al., "Traveling-Wave Metal/Insulator/Metal Diodes for Improved Infrared Bandwidth and Efficiency of Antenna-Coupled Rectifiers", IEEE Transactions on Nanotechnology, vol. 9, No. 6, pp. 716-722, Nov. 2010.

*Primary Examiner* — Rhonda S Peace
(74) *Attorney, Agent, or Firm* — BakerHostetler

(57) ABSTRACT

A rectenna device (400) for converting incident light to electrical energy is disclosed. The rectenna device comprises a substrate (402), a first metallic layer (404) having a predefined thickness deposited on top of the substrate, a
(Continued)

rectifying element (405) deposited on top of the first metallic layer, a second metallic layer (408) deposited on top of said rectifying element and configured to collect electromagnetic waves of the incident light and to couple it into plasmonic waves within the rectenna device, the second metallic layer comprising an array of a plurality of metallic patches (410) spaced from each other according to a predefined spacing, each metallic patch having predefined dimensions. The rectifying element is configured to rectify the plasmonic waves to produce a direct current, the plasmonic waves being generated at one or more operating wavelengths, and at least one dimensioning parameter of the rectenna device is determined from at least one operating wavelength, the at least one dimensioning parameter being chosen in a group comprising the dimensions of the plurality of metallic patches, the spacing of the metallic patches in the array, and the predefined thickness of the first metallic layer.

20 Claims, 15 Drawing Sheets

(56) References Cited

U.S. PATENT DOCUMENTS

| | | | |
|---|---|---|---|
| 8,750,653 B1* | 6/2014 | Peters | G01J 5/28 |
| | | | 385/12 |
| 8,847,824 B2 | 9/2014 | Kotter et al. | |
| 8,866,000 B2* | 10/2014 | DiDomenico | H01L 31/035227 |
| | | | 136/246 |
| 9,202,945 B2* | 12/2015 | Colli | H01L 31/1085 |
| 10,075,104 B2* | 9/2018 | Sheldon | H02S 99/00 |
| 10,297,752 B2* | 5/2019 | Mann | H01L 27/265 |
| 10,374,524 B2* | 8/2019 | Brady | H01L 31/00 |
| 2014/0085148 A1 | 3/2014 | Cutler | |
| 2018/0076376 A1* | 3/2018 | Brady | H01L 35/02 |
| 2020/0020683 A1* | 1/2020 | Rozin | H01L 27/0676 |

* cited by examiner

PLASMONIC RECTENNA DEVICE AND METHOD OF MANUFACTURING

CROSS-REFERENCE TO RELATED APPLICATIONS

This application is a National Stage of International patent application PCT/EP2018/082797, filed on Nov. 28, 2018, which claims priority to foreign European patent application No. EP 17306695.2, filed on Dec. 4, 2017, the disclosures of which are incorporated by reference in their entirety.

FIELD OF THE INVENTION

The present invention relates to antennas that convert photonic energy to electrical energy, and in particular to a rectenna device and a method of manufacturing such rectenna device.

BACKGROUND PRIOR ART

Worldwide energy consumption represents a major challenge of next decades. With the growth of the population and the increased use of transport tools and electrical devices, worldwide energy consumption has been growing at a rapid and an uncontrolled rate. Energy consumption is particularly important in some fields such as transport, industry, residential needs, agriculture, and telecommunications.

Energy is essentially used in the form of fossil fuels, electricity and heat energies. Major energy resources include coal, oil and natural gas, which present together around 80% of total energy supply. However, these resources are polluting the environment and have limited quantities.

Nuclear energy resources provide about 10% of the total energy supply. Although nuclear energy resources do not emit greenhouse gases, they produce spent-fuel waste. Such spent-fuel waste is radioactive and must be stored safely. Renewable energy resources, such as solar and wind, are environmentally attractive for many reasons. However, there are some notable limitations to their use. Particular limitations to the use of such renewable energy resources relate to their storage and their transformation into electrical energy which may induce considerable losses.

Currently, the conversion of photonic energy into electrical energy has been focused on photovoltaic effect using semiconductors materials such as Silicon (Si). Efficiency of photonic to electrical conversion using photovoltaic effect is estimated to be around 30%. Photovoltaic effect is based on the photonic nature of light. However, the electromagnetic nature of light can also be exploited to directly convert it into electrical energy. This concept of exploiting the electromagnetic nature of light for direct conversion into electrical energy was proposed by Robert Bailey in 1972 and patented under the publication reference U.S. Pat. No. 3,760,257 A.

As used herein, "light" refers to all sort of photonic radiation (also called "optical radiation" or "optical oscillation" or "solar radiation") and is not limited to the radiation of sun light. The light is characterized by two properties: the particle nature, also called "quantum" nature, and the wave nature, also called "radiation" nature.

Technological advances related to nano-structures, in particular nano-antennas and micro-antennas, coupled with the significant development on molecular rectifying elements, were exploited to directly convert solar radiation to electrical energy. In particular, rectenna (also called "rectifying antenna") were developed to achieve such conversion.

A rectenna comprises a rectifying element coupled with an antenna to directly convert incident radiation to electrical signal. The efficiency limit imposed by band gaps in photovoltaic effect can be eliminated with the use of rectifying elements which convert photonic energy into electrical energy.

U.S. Pat. No. 8,847,824 B2 proposes a rectenna which uses an antenna coupled with lumped-element detectors in which the antenna feeds into a diode. FIG. 1 displays the design of the antenna proposed by U.S. Pat. No. 8,847,824 B2. The antenna 110, 120 resonates on particular wavelength in optical regime, coupled to a diode 130 with strip-lines 140, 150. The strip-lines 140, 150 work both as transmission line and impedance matching network to maximize power transfer to MIM diode 130 (MIM stands for Metal-Insulator-Metal) which converts an incident electromagnetic signal or wave to direct electrical current. The lumped element diode has small tunneling time. However, the operating bandwidth of such lumped-element detector is limited and depends on the diode capacitance. Moreover, in order to maximize the power transfer, the diode impedance must be equal to the antenna impedance which is in the order of magnitude of 100 Ohms. Further, since most of the metals are absorbent in optical frequencies, the loss associated with the metallic strip-lines used for impedance matching is significant.

Another rectenna approach has been proposed in Grover et al., in their article "Traveling-wave Metal/Insulator/Metal diodes for improved infrared bandwidth and efficiency of antenna-coupled rectifiers," (IEEE transactions on Nanotechnology, vol. 9, no 6, pages 716-722, November 2010, doi 10.3109/TNANO.2010.2051334). Such approach proposes a detector based on traveling wave MIM diode. FIG. 2 displays the design of such detector, which consists of an antenna 210 connected to two metallic layers 220 and 230 with very thin insulator 240 in between. The insulator layer 240 in such a diode is formed by the metal oxides, on the metal surface when exposed to air. The metallic layers 220 and 230 with a thin insulator 240 in between form a MIM tunnel diode which has the characteristics of plasmonic waveguide. Although the traveling wave MIM diode improves the responsivity compared to a conventional lumped element diode, the very thin insulating layer leads to low coupling of incident light to the waveguide structure, to high losses, which involves lower quantum efficiency than the quantum efficiency obtained with a conventional lumped element based rectenna.

Another approach is proposed in WO 2016/202995 A1 which discloses an organic photo-detector device for detection of infrared, visible and ultraviolet radiations, the organic photo-detector containing a spectral response capable of being tuned to obtain a raised sensibility to various wavelengths of design. FIG. 3 displays the design of the organic photo-detector disclosed in WO 2016/202995 A1. The organic photo-detector includes at least a substrate 31, a first electrode 32, a second electrode 34 and at least an organic material 33, which is ordered between the first electrode 32 and the second electrode 34, a Schottky barrier being formed at the level of the interface between the first electrode 32 and the organic material 33 and/or between the second electrode 34 and the organic material 33. A target sensibility of the organic photo-detector is obtained by structuring at least an electrode so that it includes nano-openings for excitement of resonance of surface plasmon. Within the device proposed by WO 2016/202995 A1, photons on the metal of the first electrode 32 are absorbed by the free electrons of the metal. The free electrons of the metal, in the excited state provoked by the absorption of photons, exceed the Schottky barrier. The efficiency of the photo-emission of electrons through the Schottky barrier depends on the structuring of the electrodes which allows to couple propagating or even localized surface plasmons. These surface plasmons become "hot-electrons" whose energy is sufficient to exceed the Schottky barrier and be emitted in the form of molecular states in the organic material 33 and produce a photocurrent. Such photo-electric hot-electron device exploits the particle nature of the photon. A current can be produced due to non-radiative decay of Localized Surface Plasmon Resonances (LSPR) in noble metals and intra-band excitation of electrons which can be extracted from the metals using Schottky diodes.

However, due to the particle nature of such process, the operating spectral range of such photo-electric hot-electron device is limited by the work function of metals, for examples, around 5.1 eV for gold and around 4.3 eV for silver. Further, in WO 2016/202995 A1, the configuration of the plasmonic structure must be optimized to maximize the light absorption by the metal at the desired design wavelength.

There is accordingly a need for an improved device for direct conversion of electromagnetic waves into electrical energy while maximizing the efficiency of the conversion and a method of manufacturing the same.

SUMMARY OF THE INVENTION

In order to address these and other problems, there is provided a rectenna device for producing electrical energy from photonic radiations while maximizing the efficiency of such conversion.

According to a first aspect of the present invention, there is provided a rectenna device as further described in the appended independent claim 1.

Particularly, a rectenna device for converting incident light to electrical energy, comprises:
a substrate;
a first metallic layer deposited on top of said substrate, said first metallic layer having a predefined thickness;
a rectifying element deposited on top of said first metallic layer;
a second metallic layer configured to collect electromagnetic waves of the incident light and to couple it into plasmonic waves within the rectenna device, the second metallic layer comprising an array of a plurality of metallic patches spaced from each other according to a predefined spacing, each metallic patch having predefined dimensions,
wherein the rectifying element is configured to rectify the plasmonic waves to produce a direct current, the plasmonic waves being generated at one or more operating wavelengths, and at least one dimensioning parameter of the rectenna device is determined from at least one operating wavelength, said at least one dimensioning parameter being chosen in a group comprising the dimensions of said plurality of metallic patches, the spacing of the metallic patches in said array, and the predefined thickness of the first metallic layer.

Further embodiments are described in the appended dependent claims.

According to a second aspect of the present invention, there is provided a method of manufacturing a rectenna device for converting incident light to electrical energy, the method comprising:

determining at least one operating wavelength at which said rectenna device resonates;
preparing a substrate, comprising cleaning and coating operations;
depositing a first metallic layer on top of said substrate;
depositing a rectifying element on top said first metallic layer, the rectifying element having a predefined thickness and being configured to rectify plasmonic waves generated by the rectenna device from the electromagnetic waves of the incident light at the vicinity of the rectifying element;
depositing a second metallic layer on top of the rectifying element, which provides an array of a plurality of metallic patches having each predefined dimensions and being spaced from each other according to a predefined spacing,
wherein, the method further comprises:
collecting electromagnetic waves of the incident light by said second metallic layer, and
determining at least one dimensioning parameter of the rectenna device from at least one operating wavelength, said at least one dimensioning parameter being chosen in a group comprising the dimensions of said plurality of metallic patches, said spacing of the metallic patches, and the predefined thickness of said first metallic layer.

Further embodiments are described in the appended dependent claims.

BRIEF DESCRIPTION OF THE DRAWINGS

The invention will be better understood and its various features and advantages will emerge from the following description of a number of exemplary embodiments and its appended figures in which.

DETAILED DESCRIPTION OF THE INVENTION

Figure 1:
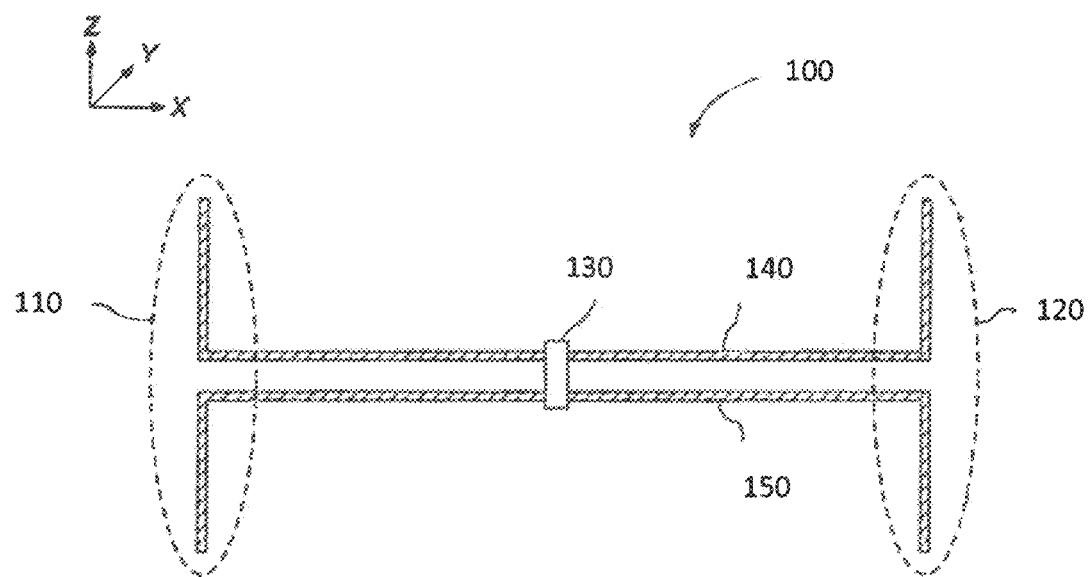
FIG. 1 is a diagrammatic view of a rectenna device comprising an antenna coupled with lumped-element detectors, from the prior art.
Figure 2:
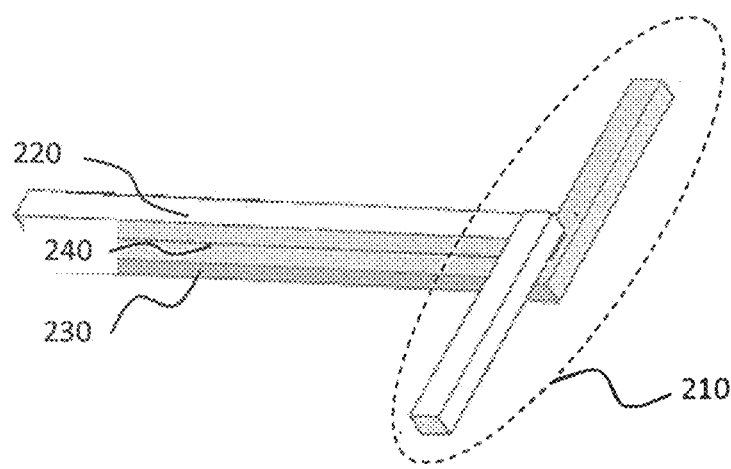
FIG. 2 is a diagrammatic view of a rectenna device comprising a detector based on traveling wave MIM diode, from the prior art.
Figure 3:
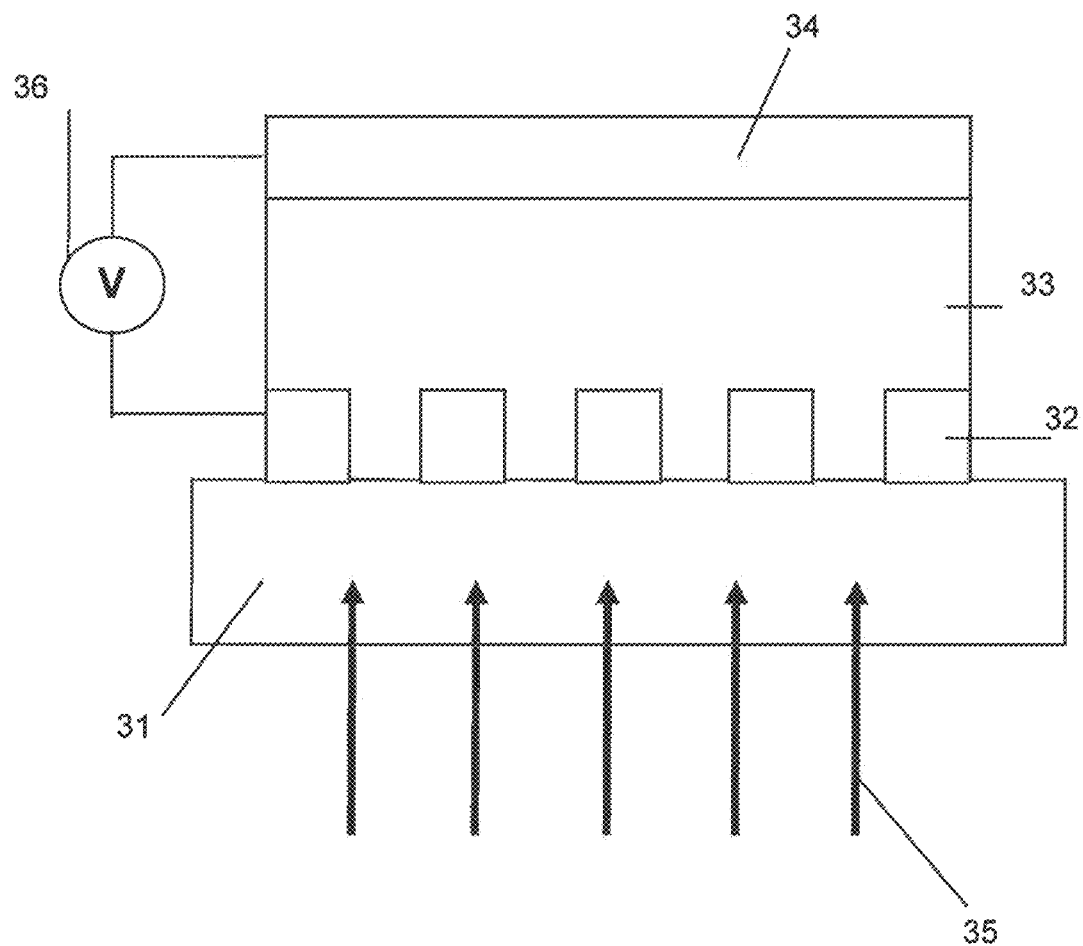
FIG. 3 is a diagrammatic view of an organic photodetector for detecting infrared, visible, and ultraviolet radiation, from the prior art.

Embodiments of the present invention provide an improved rectenna device and a method of manufacturing such rectenna device.

The embodiments of the invention may be applied in several applications comprising, without limitation, the conversion of electromagnetic waves in electricity, photodetection and imagery in devices operating in the visible (wavelength ranging between 0.38 µm and 0.780 µm) and infrared (wavelength ranging between 0.78 µm and 0.5 mm) domains. The embodiments of the invention may be used in applications related to solar energy harvesting or conversion of waste heat into electricity, with other possible breakthroughs concerning photodetection and imagery in infrared domains.

The invention will be described hereinafter with reference to examples related to direct conversion of photonic energy into electrical energy based on molecular diodes, using the electromagnetic wave nature of photonic radiation, for illustration purposes only. However, the skilled person will readily understand that other technologies related to the manufacturing of nano-antennas and micro-antennas coupled to techniques related to molecular rectifying elements can be used alternatively to directly convert an incident light into electrical energy.

To facilitate the understanding of some embodiments described hereinafter, the following definitions are provided.

As used herein, "light" refers to a photonic signal having a photonic energy and being characterized by two natures (or properties), namely a particle nature, also called "quantum" nature, and a wave nature, also called "radiation" nature.

A rectenna (also referred to hereinafter as a "rectenna device" or a "rectifying antenna") comprises a rectifying element coupled with an antenna to directly convert incident photonic radiation to electrical energy.

Unlike conventional photo-electric hot-electron devices which exploit the particle nature of the photon, rectennas use the wave nature of photonic radiation to directly convert an incident light into electrical energy.

A rectenna may be of optical type. In an optical rectenna, electromagnetic waves in visible or in the near infrared region can cause an oscillation of the conduction electrons in metallic nano-antennas generating thus an Alternating Current (AC) current.

When electromagnetic waves enter a rectenna device, conduction electrons are subject to rapid oscillations of the conduction electron in the conducting media of the rectenna device. Such couplings between electromagnetic waves and conduction electrons are referred to as "plasmonic waves". This may generate an AC current (AC stands for Alternative Current) having a high frequency, which can range for example between $1.2.10^{14}$ Hz THz and $10^{15}$ Hz for the solar spectrum. Such AC current may be rectified with very high frequency diodes to obtain a DC current (DC stands for Direct Current). These mechanisms are similar to the mechanisms generated during the reception of radio waves with conventional antennas. The AC current generated in the plasmonic nano-antennas may be rectified into a DC during the plasmonic wave oscillation.

As used herein, the efficiency of photonic-to-electrical conversion refers to the proportion ratio between the photonic energy given as an input and the electrical energy produced as an output. A theoretical efficiency of 100% refers to a conversion without any loss of energy.

The "overall efficiency" of rectenna is obtained by multiplying four factors:
the efficiency of coupling incident radiation to antenna,
the efficiency of propagating collected energy from the antenna to the diode,
the efficiency of coupling the surface wave to the diode,
the efficiency of rectifying the power received in the diode.

The efficiency of coupling an incident radiation to the antenna structure represents an important factor for determining the overall efficiency of a rectenna structure.

Although increasing the thickness of insulating layer used in MIM tunneling diode rectennas increases the efficiency of coupling, it increases also the resistance per unit area of the MIM diode, which in turns decreases the responsivity and ultimately the quantum efficiency. Using molecular diode as a rectifying element allows overcoming such limits of MIM diodes.

The operating frequency of a rectenna device, also called the working frequency, refers to the resonance frequency of the rectenna device and corresponds to an operating wavelength, also called resonance wavelength and noted hereafter $\lambda_{reso}$.

Size (or width) refers to the width, the length and the height of rectangular patches. It refers to the height and the diameter of circular patches. When the antennas comprise metallic patterns which are not rectangular or circular, the size refers to the dimensions which allow to define the pattern.

The periodic lattice which forms the rectenna is composed of a metallic pattern which is repeated periodically in space. The elementary cell is defined as the smallest fraction of space, with a finite volume, such as it can ensure the space paving by translation of a vector t=m.a+n.b+p.c ((n,m,p) are positive integers). Where a, b and c are three vectors which can be written as a function of the unity vectors of an otrhonormal reference a=a.ex, b=b.ey and c=c.ez. Then the periodicity (or spacing) along an axis is given by a, b and c.

Embodiments of the invention provide a rectenna device for converting incident light to electrical energy with a high efficiency. The rectenna structure according to the various embodiments of the invention increases significantly the thickness h of the core material in a rectenna without affecting the diode performance while increasing the coupling of incident light into the rectenna structure. The core material may consist of a diode structure or a diode structure covered with an additional conductive oxide.

Figure 4:
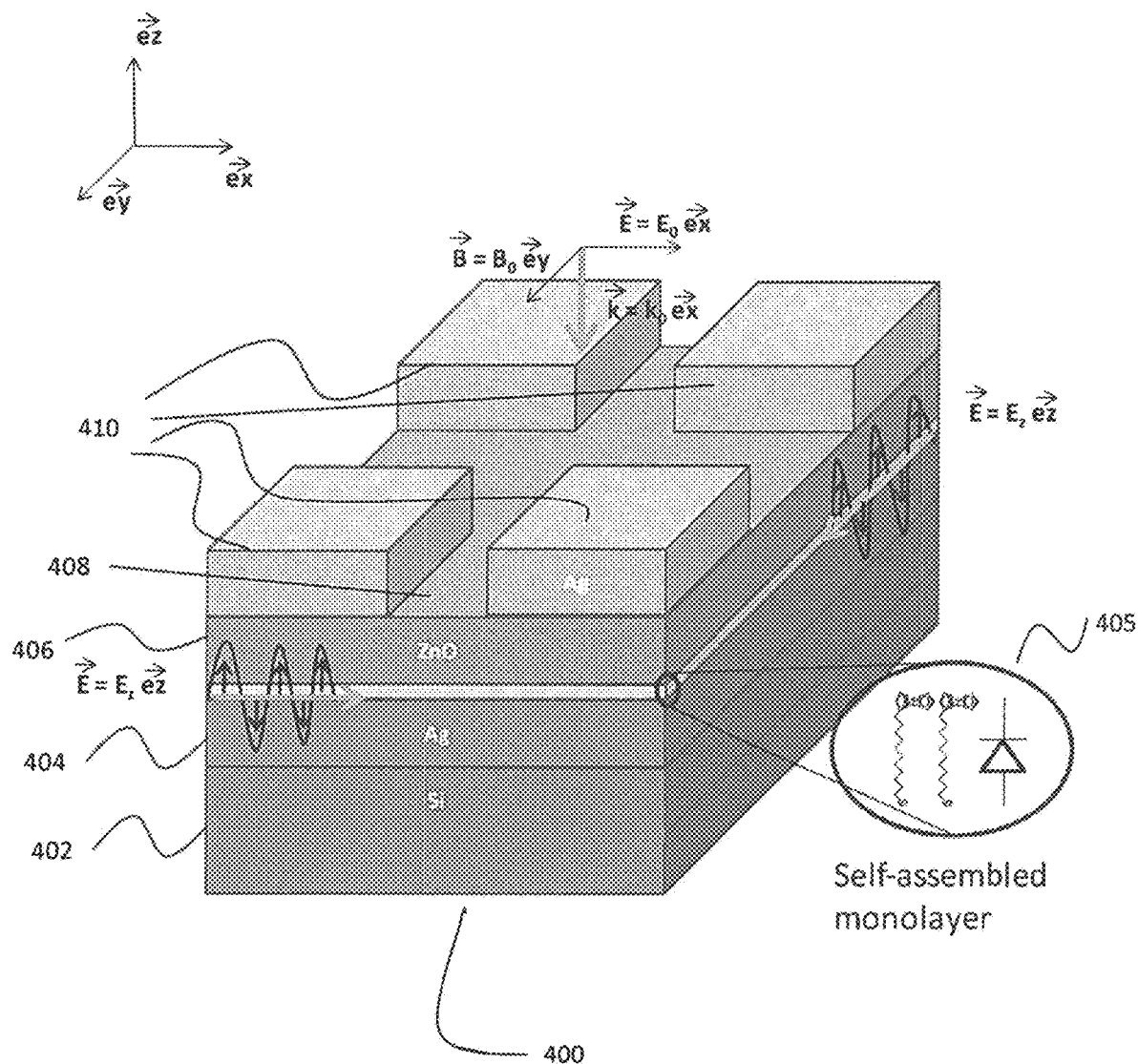
FIG. 4 is a diagrammatic view of a rectenna device, according to some embodiments of the invention.

Referring to FIG. 4, there is shown a rectenna device 400 configured to convert incident light to electrical energy, the rectenna device 400 comprising
- a substrate 402;
- a first metallic layer 404 deposited on top of the substrate 402, the first metallic layer 404 having a predefined layer thickness;
- a rectifying element 405 (referred to as 'rectifying layer') deposited on top of the first metallic layer 404;
- a second metallic layer 408 configured to collect electromagnetic waves of the incident light, the second metallic layer 408 comprising an array of a plurality of metallic patches 410 spaced from each other according to a predefined spacing (i.e. a predefined periodicity), each metallic patch 410 having predefined dimensions (i.e. predefined sizes).

The rectifying element 405 may be configured to rectify the plasmonic waves to produce a direct current, the plasmonic waves being generated from the electromagnetic waves at one or more operating wavelengths at the vicinity of the first metallic layer 404 and the rectifying element 405 to produce a DC current.

At least one dimensioning parameter of the rectenna device 400 may be determined from at least one operating wavelength, the at least one dimensioning parameter being chosen in a group comprising the dimensions of the plurality of metallic patches 410 (e.g. the lateral dimensions width and/or length of the patches), the spacing or periodicity of the metallic patches 410, and the predefined thickness of the first metallic layer 404.

According to some embodiments, the substrate 402 may be made of Silicon (Si).

In some embodiments of the invention, the first metallic layer 404 and/or the second metallic layer 408 may be formed from a material chosen for example, but not limited to, in a group comprising Aluminum (Al), Silver (Ag), Gold (Au), Tungsten (W), or Copper (Cu).

In some embodiments, the metallic patches 410 may act as scattering centers which couple the incident light into the core material.

In some embodiments, the metallic patches 410 may have each a predefined geometry and predefined dimensions/sizes.

The metallic patches 410 may have a particular geometry such as, but not limited to, a circle, ellipse, a rhombic, rectangular, square or strip form for example. Preferably, all the metallic patches 410 may have the same geometry.

In some embodiments, the metallic patches 410 may be arranged periodically in a lattice (also referred to as 'array'). The metallic patches 410 may be arranged along the array with a predefined periodicity between each pair of metallic patches. The lattice of the periodic metallic patches 410 arrangement may have a form such as, but not limited to, a square, a hexagonal, a triangular, or a rhombic form. For example, in the embodiment represented in FIG. 4, the metallic patches 410 may be arranged according to a square lattice.

In other embodiments, the metallic patches 410 may be arranged randomly in order to broaden the working spectral range of the rectenna device 400.

In one embodiment, the second metallic layer 408 may comprise an array of several metallic patches 410 made of silver (Ag), having given shapes such as square shapes.

In some embodiments, the metallic patches 410 may be defined by a set of parameters such as the periodicity P of the array and the width W of the second metallic layer 408.

In embodiments where the plurality of metallic patches 410 of the second metallic layer 408 are arranged periodically, the periodicity P of the array of the plurality of the metallic patches 410 may vary between 10 nm f to 20 micrometers. This enables harvesting electromagnetic waves in the visible and the near infrared.

In some embodiments, the thickness of the rectifying element 405 may be very small to enable good charge transportation properties. In particular, the rectifying element 405 may have a thickness $h_{OL}$ ranging from 0.1 to 10 nm (0.1 nm≤$h_{OL}$≤10 nm).

According to some embodiments, the rectifying element 405 may be made of self assembled rectifying molecules.

In particular embodiments, the rectifying element 405 may comprise one or more molecular diodes. The generated plasmonic waves may be rectified by one or more molecular diodes to produce a DC current. However, it should be noted that the invention is not limited to a rectifying element 405 made of molecular diodes.

In some embodiments, the rectifying element 405 may comprise one or more self-assembled molecular diodes.

In some embodiments, the rectifying element 405 may be integrated in a resonant photonic structure. In particular, the one or more molecular diodes may be integrated in a resonant photonic structure.

The molecular diodes may rectify an AC current due to their intrinsic electrical properties.

In some embodiments, the rectifying element 405 may comprise a self-assembled monolayer formed by one or more molecular diodes, in the top of first metallic layer 404. This enables an optimization of the extraction of charge from the silver (Ag) layer which is arranged in the bottom of the organic layer.

In some embodiments, the one or more molecular diodes may be formed from a group of molecules chosen in the group consisting of ferrocenyl-alkanethiol and/or styryl pyridinium and/or porphyrine and/or phtalocyanine.

In some embodiments, the one or more molecular diodes may comprise molecules functionalized with anchor such as for example thiols (—SH), which enables a fixation through covalent bounding to noble metals such as gold (Au), silver (Ag) or cupper (Cu).

In another embodiment, the one or more molecular diodes may alternatively comprise push pull molecules.

According to some embodiments, the at least one operating wavelength may range from one time to one hundred times a total thickness, the total thickness representing in such embodiments the thickness of the first metallic layer 404.

In some embodiments, the at least one operating wavelength may be upper than one time the periodicity of the array of the plurality of metallic patches.

According to some embodiments, the at least one operating wavelength may be directly proportional to the length and/or the width of one metallic patch 410 among the plurality of metallic patches 410 with a proportionality constant.

In some embodiments in which all of the plurality of metallic patches 410 have the same sizes and are arranged periodically, the rectenna device 400 may have one operating wavelength.

In some embodiments in which metallic patches 410 have different sizes and are arranged periodically, the rectenna device 400 may have several operating wavelengths.

In some embodiments, the at least one operating wavelength where plasmonic waves are generated from the received electromagnetic waves at the vicinity of the first metallic layer 404 and the rectifying element 405 may be determined from the dimensions/sizes of the plurality of the metallic patches 410, and/or the periodicity of the plurality of metallic patches 410.

The operating frequency of the rectenna device 400 having the layered structure depicted in FIG. 4, and accordingly the operating wavelength $\lambda_{reso}$ may be determined from the geometry parameters of the metallic patches 410, such as their periodicity P, and/or their width W, and the thickness h of the core material.

In some embodiments, the operating wavelength may be higher than one time the periodicity P of the plurality of metallic patches 410 according to:

$$P \le \lambda reso \quad \text{(Eq. 1)}$$

This range may be chosen to ensure that the metallic patches 410 should scatter the light.

In some embodiments, the periodicity P of the array of the plurality of metallic patches 410 may range from a quarter of a target operating wavelength λreso to a full value of the target operating wavelength λreso of the rectenna device according to:

$$\frac{\lambda' reso}{4} \le P \le \lambda' reso \quad \text{(Eq. 2)}$$

This may provide a rectenna device 400 capable of operating at a certain target operating wavelength.

In another embodiment, the operating wavelength may be at least twice the width W of the metallic patches 410 according to:

$$2W \le \lambda reso \quad \text{(Eq. 3)}$$

This range may be chosen to ensure that Fabry-Perrot like resonances can be obtained with the plasmonic waves propagating under the metallic patches between the metallic patches and the first planar metallic layers.

In one embodiment, the width of the metallic patches may be higher than the half of the value of the target operating wavelength λ'reso of the rectenna device according to:

$$W \le \lambda' reso/2 \quad \text{(Eq. 4)}$$

In some embodiments, the operating wavelength λreso of the rectenna device 400, may be determined from the width W of the plurality of metallic patches 410 and the effective refractive index of the photonic mode $$ngap = \frac{d\omega}{dk}$$

($\omega$ is the pulsation at the resonance wavelength and k is the wave vector) in the core material.

In particular, in one embodiment, the operating wavelength λreso of the rectenna device 400, may be approximated by (i.e. substantially equal to) the product of two (2), of the width W of the metallic patches 410 and of the effective refractive index of the photonic mode (ngap) in the core material according to:

$$\lambda reso \approx 2 * W * ngap \quad \text{(Eq. 5)}$$

Depending on the material used, the thickness h of the core material may be comprised between 0.1 nm and the value of the resonance wavelength λreso according to:

$$h \le \lambda reso \quad \text{(Eq. 6)}$$

According to some embodiments illustrated in FIG. 4, the rectenna device 400 may further comprise a transparent conductive layer 406 deposited on top of the rectifying element 405, the second metallic layer 408 being deposited on top of the transparent conductive layer 406. The transparent conductive layer 406 may have a predefined thickness and may be configured to generate, for at least one operating wavelength, plasmonic waves from the electromagnetic waves at the vicinity of the rectifying element 405. In such embodiments, at least one dimensioning parameter may be chosen in a group comprising the dimensions of the plurality of metallic patches 410, the spacing of the metallic patches 410 in the array, the predefined thickness of the first metallic layer 404, and the predefined thickness of the transparent conductive layer 406.

In some embodiments, the rectifying element 405 and the transparent conductive layer 406 may form the core material of the rectenna device 400.

In some embodiments, at least one operating wavelength may range from one time to one hundred times a total thickness, the total thickness h representing the sum of the thickness of the first metallic layer 404 and of the thickness of the transparent conductive layer 406.

According to some embodiments, the transparent conductive layer 406 may be chosen in a first group comprising Zinc oxide (ZnO) and Zinc sulfide, or in a second group comprising Aluminuim doped zinc oxide (ZnO:Al), Indium tin oxide (ITO), polystyrene sulfonate PEDOT:PSS, and silver nano-particles.

According to some embodiments in which the transparent conductive layer 406 is chosen in the first group, the total thickness may be up to 50 nm.

According to some embodiments in which the transparent conductive layer 406 is chosen in the second group, the total thickness may be higher than 50 nm.

In such embodiments, the thickness of the core material, formed by the rectifying element 405 and the transparent conductive layer 406, may be determined such that the conductive property of the transparent conductive layer 406 prevails.

In some embodiments, the thickness of the transparent conductive layer 406 may be determined to both optimize the control of the confinement of the electromagnetic fields at the vicinity of the one or more molecular diodes and reach the one or more target operating wavelengths of the rectenna device 400.

The inventors have analyzed that the thickness of the transparent conductive layer may strongly influence the operating wavelength of the rectenna device when it is varied from 0.1 nm nanometers to 300 nm.

Further, it has been analyzed that the thickness of the transparent conductive layer does not influence the operating wavelength when it is thicker than 50 nm of nanometers.

In some embodiments, the second metallic layer 408 and/or the transparent conductive layer 406 may be an electrode. The following description of some embodiments will be made with reference to a first metallic layer 404 and a transparent conductive layer 406 formed by two electrodes, for illustration purposes only.

In some embodiments, the rectenna device 400 may be a plasmonic rectenna comprising a plasmonic antenna and one or more molecular diodes.

Further, the operating wavelengths at which plasmonic waves are generated may be rectified by the at least one molecular diode to produce a DC current.

The electromagnetic waves of the incident light may be collected by the plurality of metallic patches 410 of the second metallic layer 408, thereby generating plasmonic waves having plasmonic modes.

Figure 5:
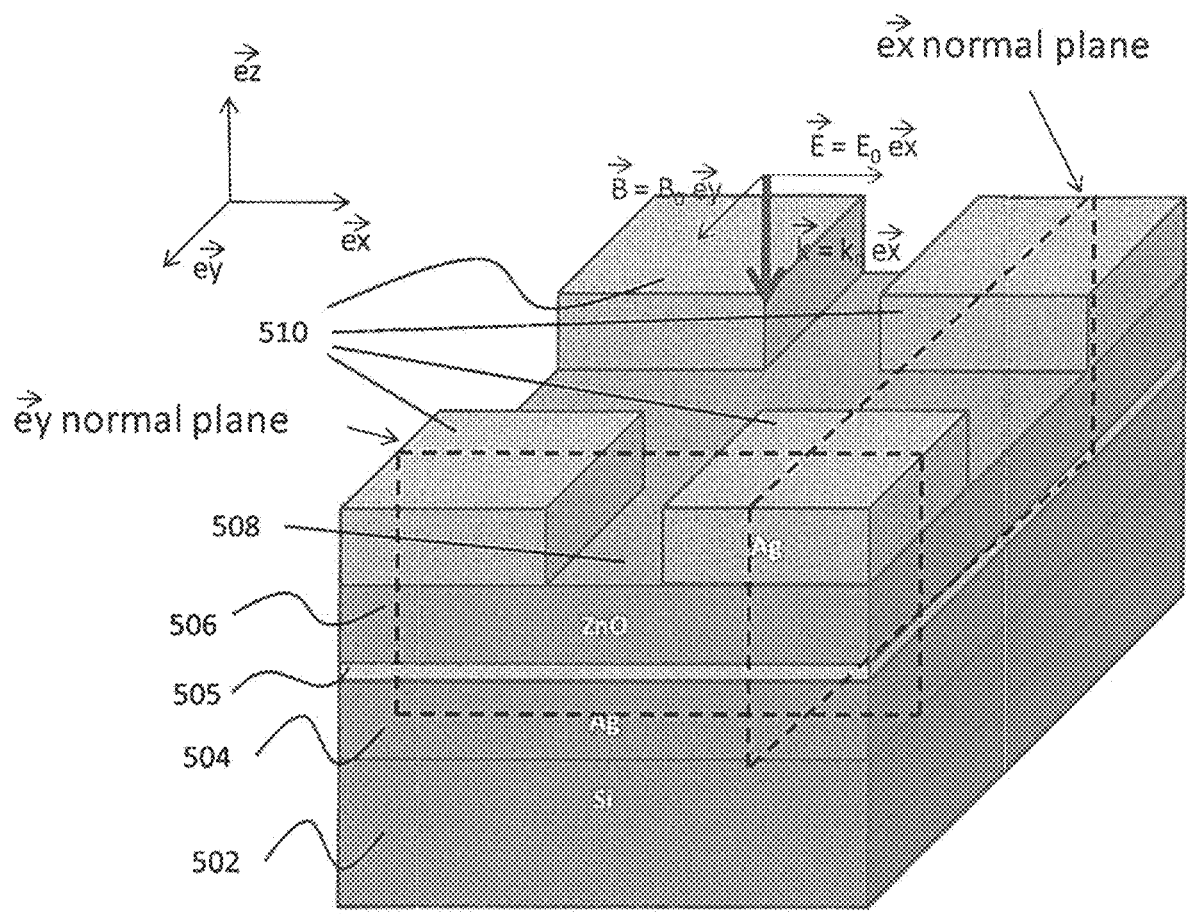
FIG. 5 is a diagrammatic view of a rectenna device, according to some embodiments of the invention.

The ex, ey and ez unit vectors depicted in FIG. 4 and FIG. 5 define a Cartesian coordinate system, wherein ex and ey unit vectors define respectively the abscissa axis and the ordinate axis of the plan on which the substrate 402 in deposited. The first metallic layer 404, the rectifying element 405, the transparent conductive layer 406, and the second metallic layer 408 are deposited upon the substrate 402 following the ez unit vector which defines the altitude axis. The electrical field parallel respectively to the abscissa, ordinate and altitude axis is hereafter noted respectively Ex, Ey and Ez. In addition to the Cartesian coordinate system of FIG. 4, the ex and ey normal planes are illustrated in FIG. 5.

The incident electromagnetic waves may be harvested by the plasmonic structure in order to generate plasmonic modes propagating along the first metallic layer 404 and exhibiting an electric field along the molecular diodes, along the ez unit vector, as depicted in FIG. 4.

Such plasmonic modes may be excited by the second metallic layer 408, the plurality of metallic patches 410 being arranged periodically and acting as scattering and may propagate between both electrodes 404 and 408 into the core, thereby leading to an oscillation of electric fields along the molecular diodes.

According to the configuration of FIG. 4, the oscillation of the electrical field generated by the plasmonic modes may be rectified by the molecular diodes.

The design of a plasmonic rectenna device according to some embodiments of the invention may be still optimized to generate plasmonic waves which can be rectified by the molecular diodes. In particular, the plasmonic rectenna device may be arranged so that the transparent conductive layer 406 allows the plasmonic waves to be generated at the vicinity of the self-assembled molecular diodes, while the electrical fields of the plasmonic waves oscillate along the molecular diodes. This enables a rectification of the photo-induced AC current caused by the oscillation of the conduction electrons by the molecular diodes.

Light harvesting optimization and computation of the transfer of energy to the molecular diodes may be performed using optical processing techniques such as Finite Difference Time Domain (FDTD) methods. Such processing techniques allow predicting the optical properties of the plasmonic structures.

Figure 6:
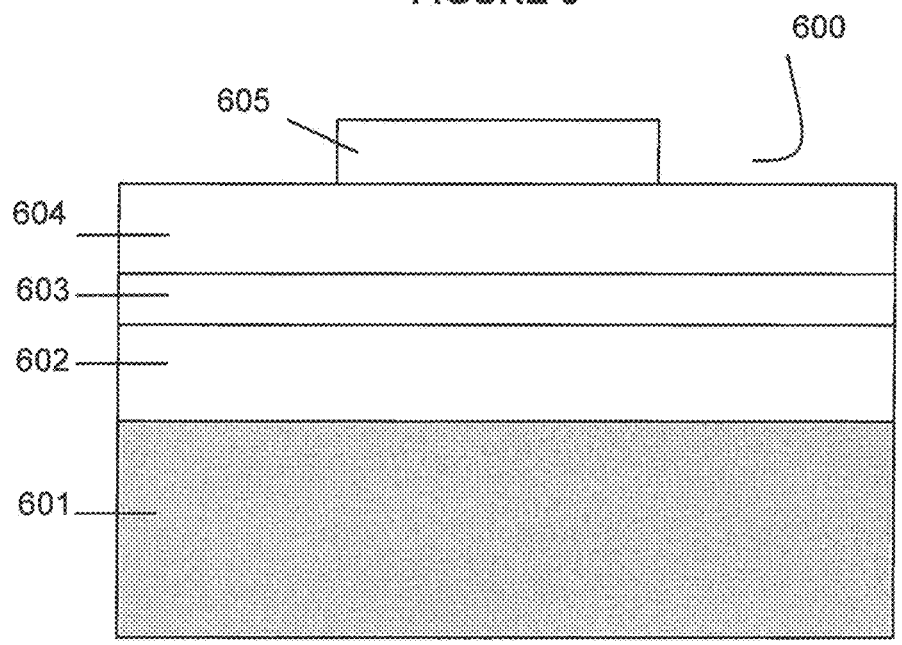
FIG. 6 is a diagrammatic view of a multi-layer structure of a rectenna device, according to an embodiment of the invention.

FIG. 6 shows a multi-layer structure of a rectenna device 600 configured to operate at a wavelength of 1550 nm, in an exemplary embodiment of the invention. The exemplary rectenna device 600 of FIG. 6 has a layered structure which may comprise:

- a silicon substrate 601;
- a first flat metallic layer 602 formed from silver (Ag) deposited on top of the silicon substrate 601;
- a rectifying molecular diode layer 603 deposited on top of the first metallic layer 602;
- a transparent conductive layer 604 formed from zinc oxide (ZnO) deposited on top of the rectifying molecular diode layer 603, and
- a second metallic layer 605 made of square shaped silver patches of width W of 320 nm arranged periodically with a periodicity P of 850 nm, in a square lattice.

In such embodiments, the thickness h of the core material (composed of the rectifying molecular diode 603 the transparent conductive layer 604) is 50 nm.

Figure 7:
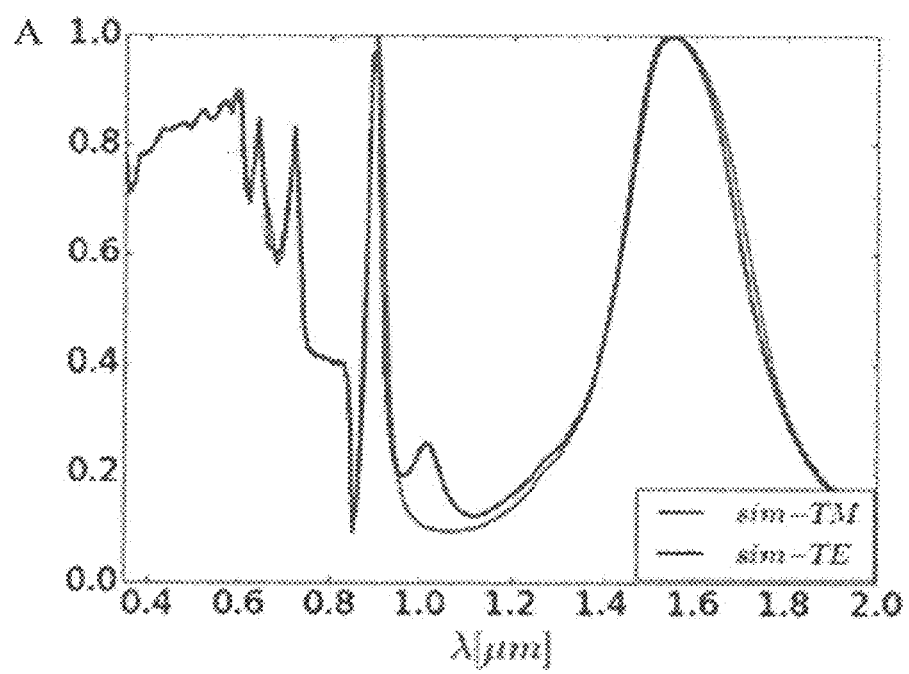
FIG. 7 is a diagram representing the absorption spectrum of a rectenna device, according to an embodiment of the invention.

FIG. 7 shows the absorption spectrum of a rectenna device 600 configured to operate at a wavelength of 1550 nm in a exemplary embodiment of the invention, according to the embodiment of FIG. 6, in a Transverse Electric mode (TE) and a Traverse Magnetic mode (TM). The absorption spectrum exhibits two absorption peaks resulting from light coupling into two different plasmonic modes and centered respectively at 900 nm and at 1550 nm.

Figure 8:
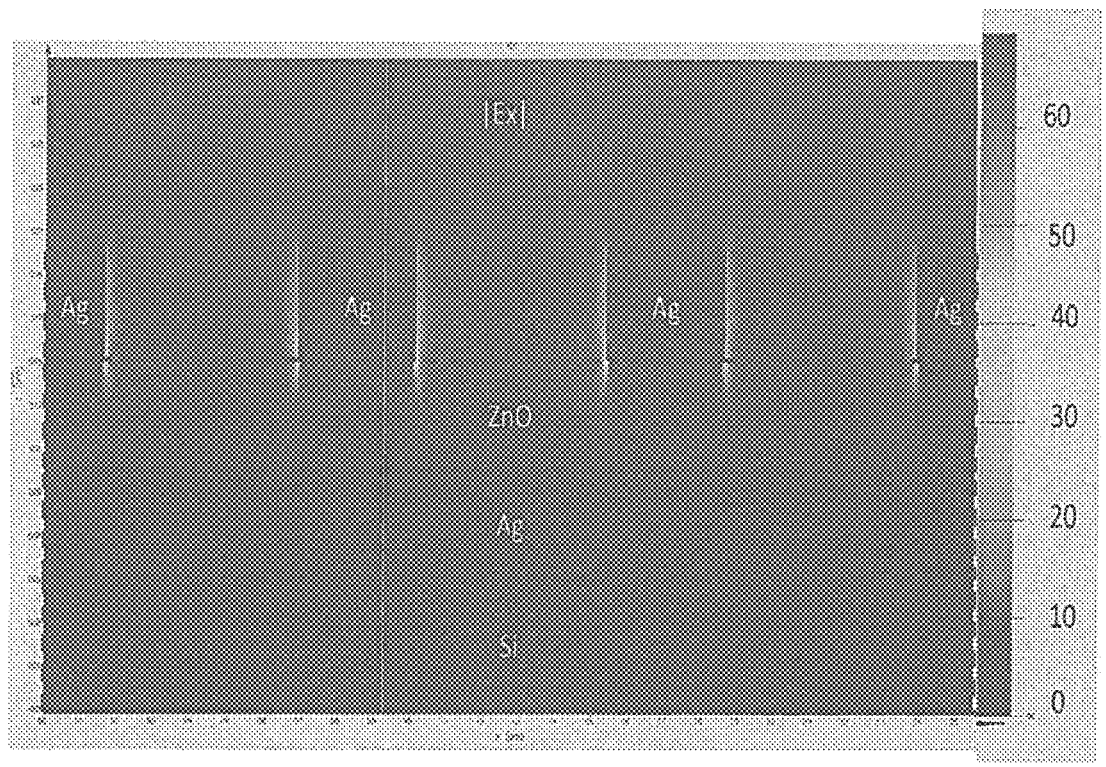
FIG. 8 is a diagram representing a 2D mapping of a plasmonic mode centered at 1550 nm performed in a plane normal to the ey axis, according to some embodiments of the invention.
Figure 9:
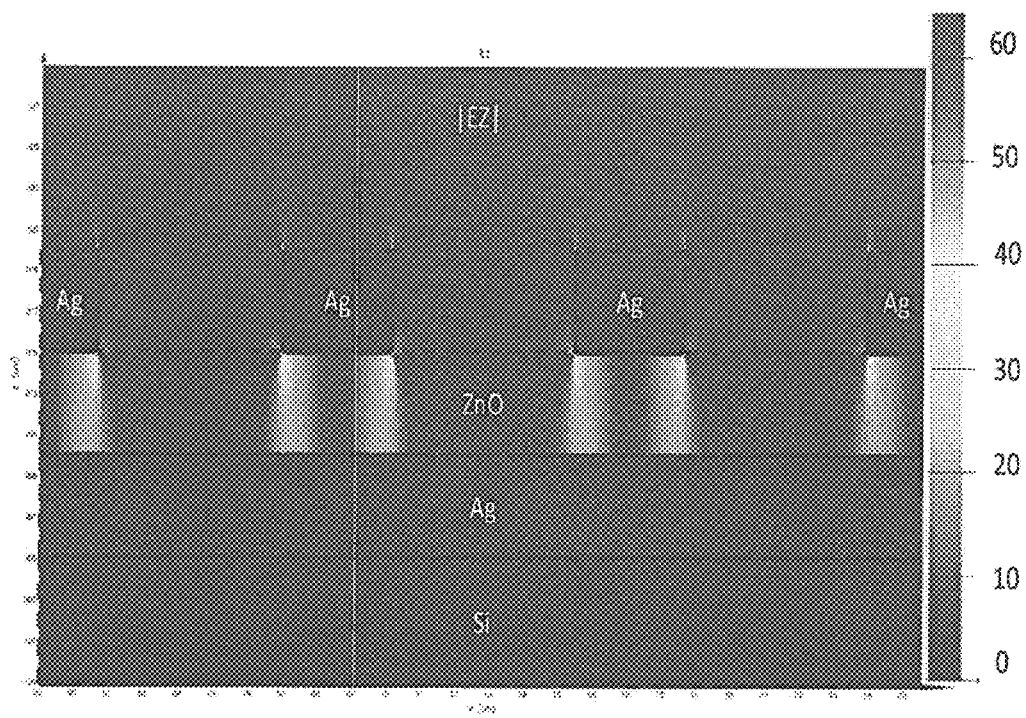
FIG. 9 is a diagram representing the absolute value of 2D normalized mappings of a plasmonic mode centered at 1550 nm, according to some embodiments of the invention.

To obtain the absorption spectrum, 2D mappings of the mode centered at 1550 nm have been performed in planes normal to the ex axis and normal to the ey axis. FIGS. 8 and 9 are diagrams illustrating the obtained mappings. Such 2D mapping shows that there is an exaltation of the Ex electrical field on the side edge of the silver (Ag) patches and an exaltation of the Ez electrical field within the Zinc oxide (ZnO) layer at the vicinity of the molecular diodes which are coated on the flat Ag layer. Thus, the Ez field oscillates along the molecular diodes and contributes to an AC current which can be rectified.

Figure 10:
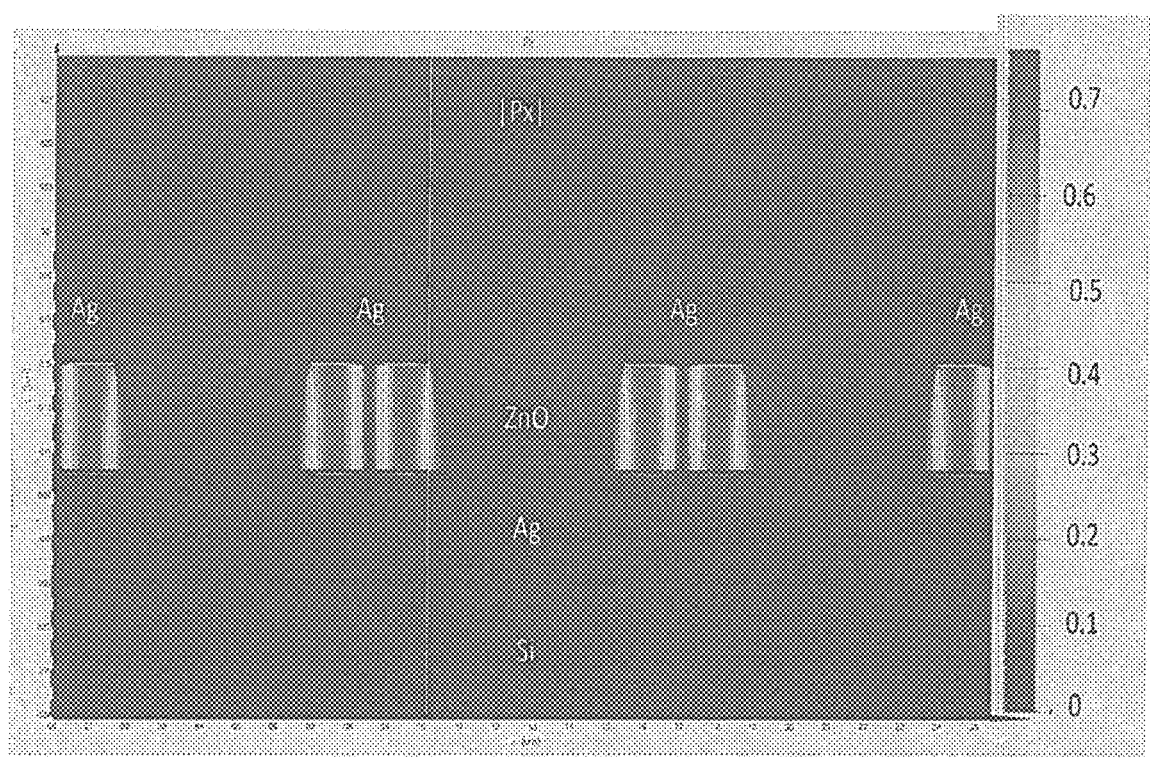
FIG. 10 is a diagram representing the absolute value of 2D total mappings of a plasmonic mode centered at 1550 nm, according to some embodiments of the invention.

Such results are still confirmed by the mappings depicted in FIG. 10 and corresponding to the mappings of the total pointing vector P and its components projected on ex and ey axes.

The main part of the energy may be propagated along the ex axis between both Ag electrodes within the Zinc oxide (ZnO) layer leading to an oscillation of the Ez fields along the molecular diodes. The mode centered at 1550 nm allows a transfer of light energy from the plasmonic structure to the molecular diodes. The modes are confined below the silver (Ag) patches due to a Fabry-Perrot effect along the x axis. The energy transfer from the incident medium (air) through the molecular diodes has to be maximized and the transferred energy has to propagate in the shape of electromagnetic waves. These electromagnetic waves have to propagate along the interface between the first unpatterned metallic layer 602 and the molecular diodes 603. The energy transfer can be estimated by calculating the electromagnetic energy flow propagating along the interface between the first unpatterned metallic layer 602 and the molecular diodes 603. Using the rectenna device 600 according to such embodiments, an energy transfer rate of about 48% is obtained. This value is higher than the energy transfer rate (generally lower than 10%) obtained using standard approach such as lumped element based rectennas and rectennas based on traveling wave Metal-Insulator-Metal diode (Grover et al.).

Figure 11:
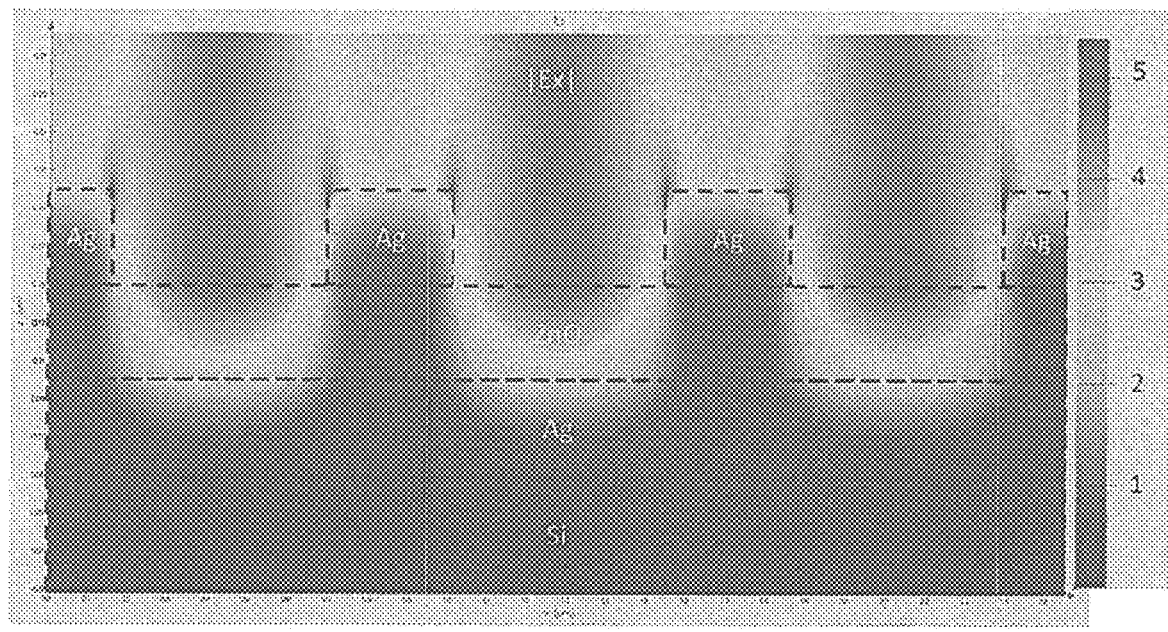
FIG. 11 is a diagram representing the absolute value of the electrical fields obtained by a 2D normalized mapping of a plasmonic mode centered at 900 nm, according to some embodiments of the invention.
Figure 12:
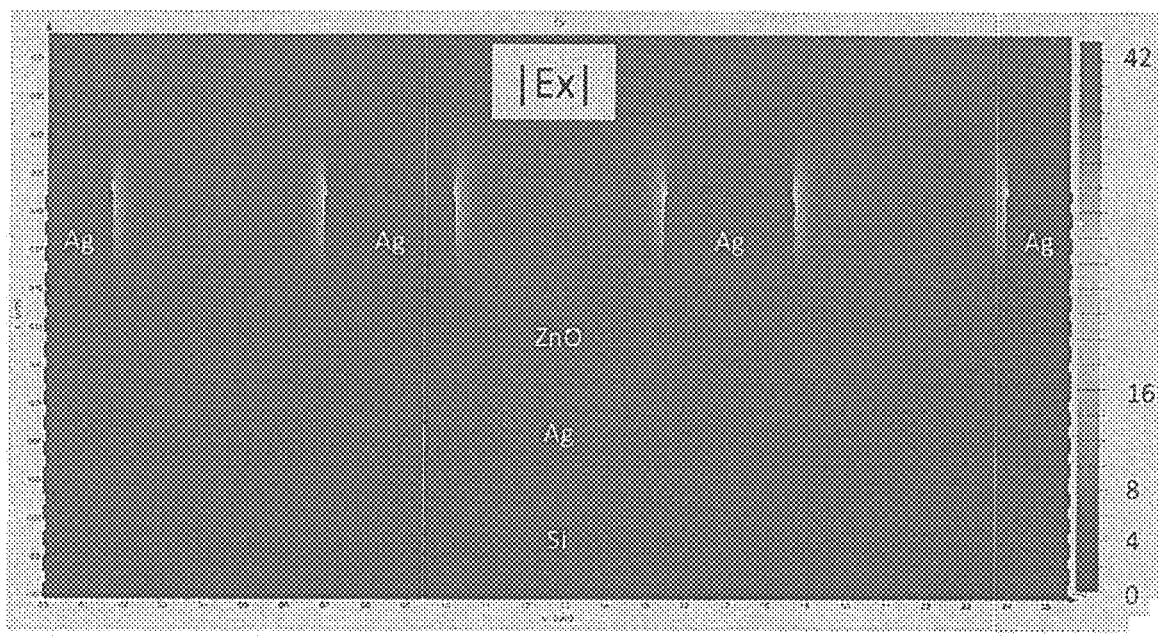
FIG. 12 is a diagram representing the absolute value of the electrical fields obtained by a 2D normalized mapping of a plasmonic mode centered at 900 nm, according to some embodiments of the invention.
Figure 13:
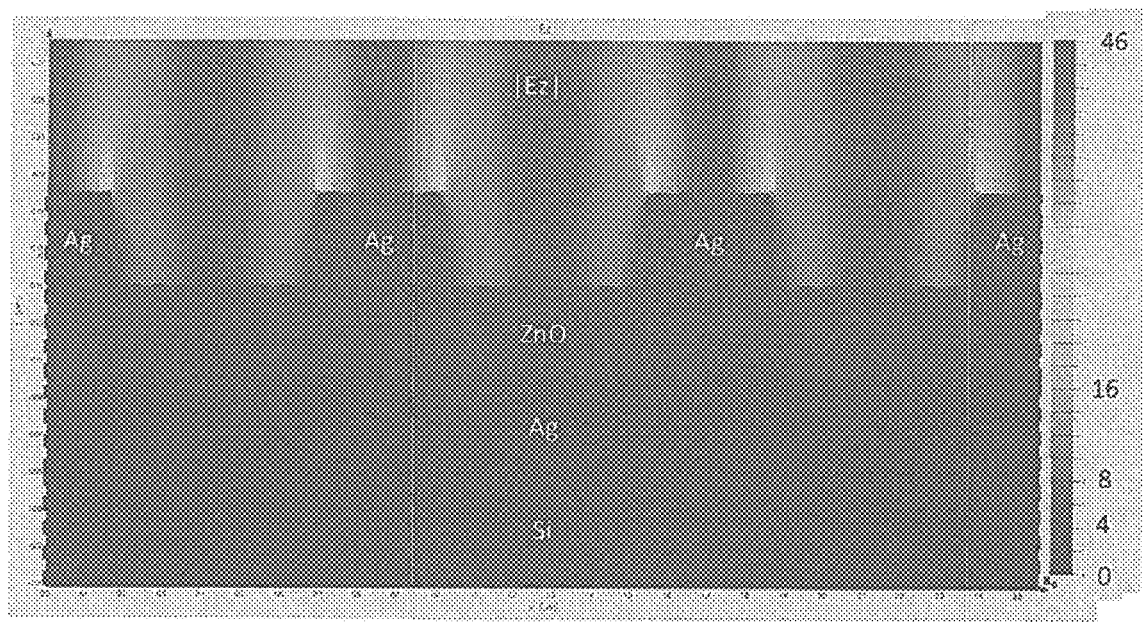
FIG. 13 is a diagram representing the absolute value of total mappings of a plasmonic mode centered at 900 nm, according to some embodiments of the invention.

In addition, 2D mappings of the modes centered at 900 nm have been performed in planes normal to the ex axis which show the absolute value of the electric fields E projected on ex (Ex) and normal to ey axis showing the absolute value of the electric fields E projected on ex (Ex) and on ez (Ez). FIGS. 11 and 12 are diagrams illustrating the obtained 2D mappings. The 2D mapping shows that the electric fields are localized on the top of the Ag patches and propagate along the x axis far from the molecular diodes. Thus, these plasmonic modes cannot be rectified by the molecular diodes to produce an AC current, unlike the modes centered at 900 nm. These results are confirmed by the mappings of the total pointing vectors P and its in-plane components illustrated through FIG. 13.

Figure 14:
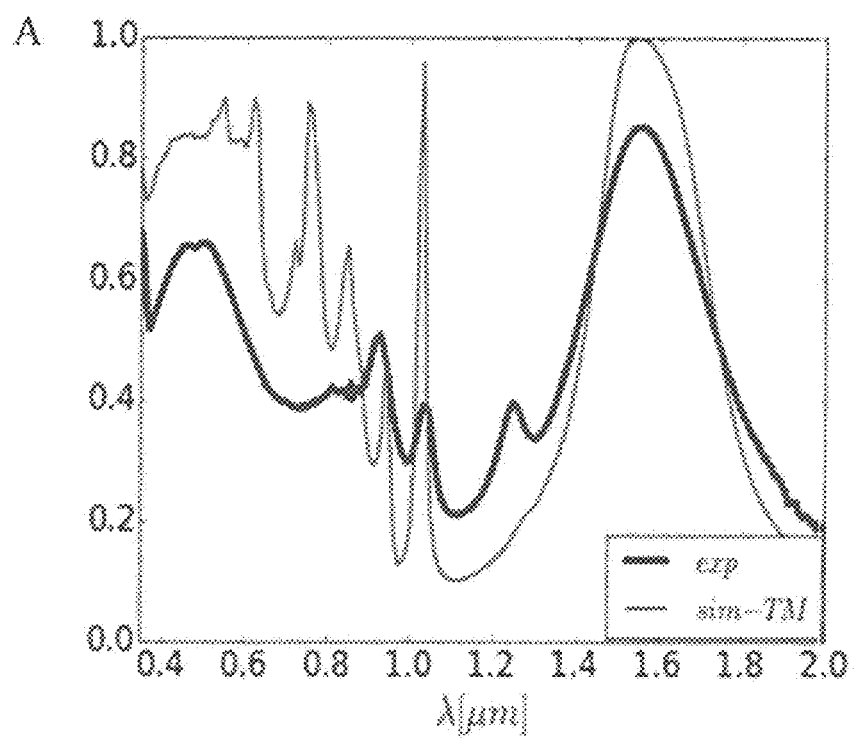
FIG. 14 is a diagram showing numerical simulation results and experimental measurements of the absorption spectrum of a rectenna device, according to an exemplary embodiment of the invention.

FIG. 14 shows the absorption spectrum corresponding to numerical simulation and experimental measurements of a rectenna device 600 configured to operate at the wavelength of 1550 nm, in an exemplary embodiment. The absorption spectrum as represented in FIG. 14 correspond to an infrared regime. In such exemplary embodiment, the rectenna device 600 has the multi-layer structure depicted in FIG. 6, with a periodic spacing between the patches equal to 850 nm, each metallic patch having a width equal to 320 nm.

It should be noted that the electromagnetic scaling rule is not limited to an infrared regime. Alternatively, it could be applied to design layered rectenna structure working at a plurality of wavelengths or frequencies ranging from visible, infrared to terahertz region.

It can be noted that there is no discrepancy between the simulations and the experiments results shown in FIG. 14, which reflects the performance reached with the configuration of the rectenna device 600 working at different spectral ranges, according to embodiments of the invention.

By collecting light with high efficiency and wide range of angles, the amount of charge generated may be increased, thereby providing a rectenna structure of a higher efficiency.

In one embodiment corresponding to the configuration of FIG. 4, the rectenna device 400 may collect incident light having range of angles of ±80°.

Figure 15:
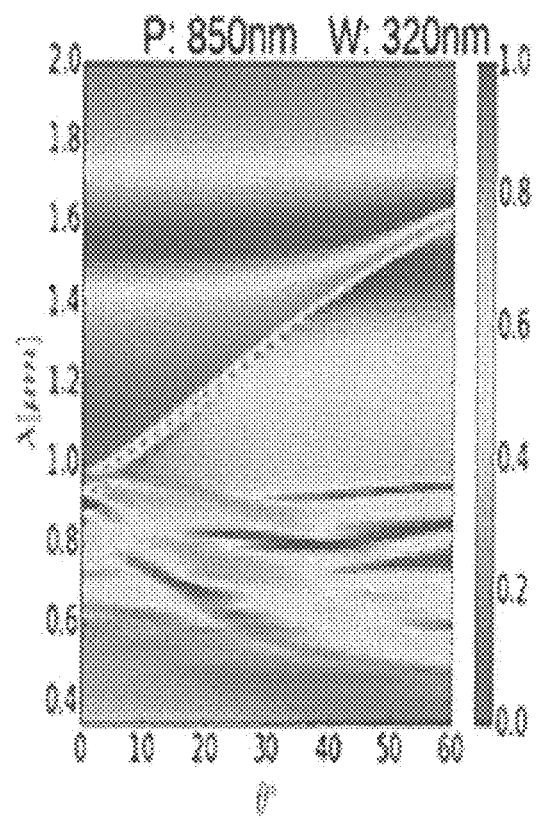
FIG. 15 is a diagram representing the evolution of the total absorption of a rectenna device as a function of incidence wavelength (λ) and incidence angle (θ), according to an embodiment of the invention.
Figure 16:
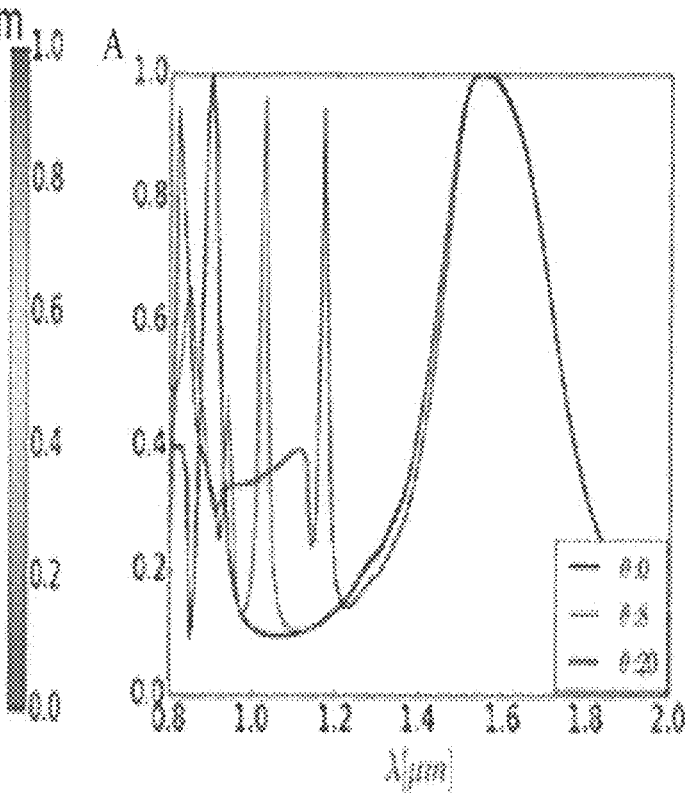
FIG. 16 is a diagram representing the evolution of the total absorption of a rectenna device as a function of incidence wavelength (λ) and for three different angles (0°, 8° and 20°), according to some embodiments of the invention.

FIGS. 15 and 16 are diagrams showing the evolution of the absorption spectrum as a function of incidence angle (θ) of a rectenna device 300 configured to operate at the wavelength of 1550 nm, in an exemplary embodiment of the invention in which considered rectennas are made of square shaped silver patches of width W of 320 nm arranged periodically with a periodicity P of 850 nm, in a square lattice.

For many applications, the angle of incidence is not strictly normal. It is therefore important to study angle dependent response of rectenna structure to evaluate if the resonance and amount of absorption changes when angle of incidence is varied. It is shown in FIG. 15 that the primary resonance (1.55 µm), because of its localized nature, does not vary when incident angle is changed. It is a valuable benefit compared with guided photonic modes which strongly depend on the incidence angle. These results show that the absorption of the incident light by the rectenna is close to unity for a wide range of incident angles at the operating wavelength (1550 nm). This absorption peak is due to the coupling of a plasmonic cavity mode at the vicinity of the molecular diodes which are known to weakly depend on the incidence angle. The second peak, at 900 nm for a normal incidence correspond to a guided photonic mode coupled at the top of the grating and such a mode, unlike the modes centered at 1550 nm, are known to strongly depend on the incident angle.

FIG. 16 represents the evolution of the spectral absorption A as a function of incidence wavelength (λ) for different values of incidence angle (θ) of a rectenna device 600 configured to operate at the wavelength of 1550 nm, in an exemplary embodiment of the invention.

In some embodiments in which the array of a plurality of metallic patches 410 comprises metallic patches having different patch dimensions, the working wavelength of a patch array may strongly depend on the lateral dimensions of the metallic patches 410. Thus, by using patches with different lateral dimensions (width and length), the rectenna device 400 may advantageously operate at a plurality of working wavelengths. An array of patches with defined dimensions is called a pattern (S1 and S2). The number n of working wavelengths is equal to the number n of the different patch arrays.

Figure 17:
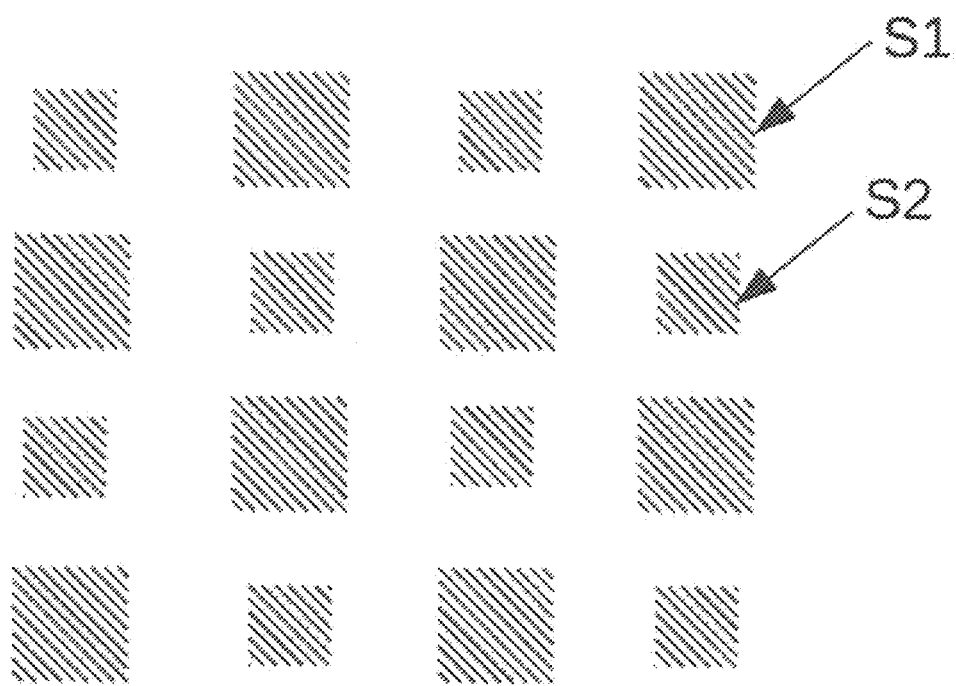
FIG. 17 depicts an array of a plurality of metallic patches having a square form of two different dimensions S1 and S2, according to some embodiments of the invention.

FIG. 17 represents an exemplary array of a plurality of metallic patches 410 arranged according to a periodic spacing, each metallic patch 410 having a square form with one among two different dimensions S1 and S2, the rectenna device 400 operating at two different operating frequencies.

Figure 18:
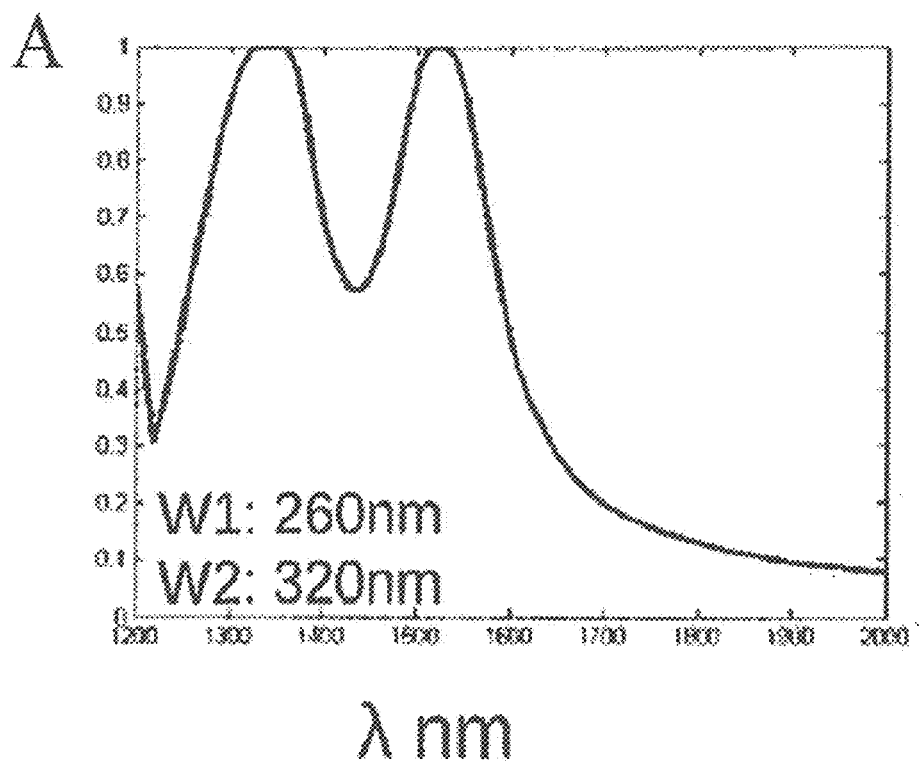
FIG. 18 is a diagram representing numerical simulation of the absorption spectrum of a rectenna device having an array of a plurality of metallic patches of different lateral dimensions, according to some embodiments of the invention.
Figure 19:
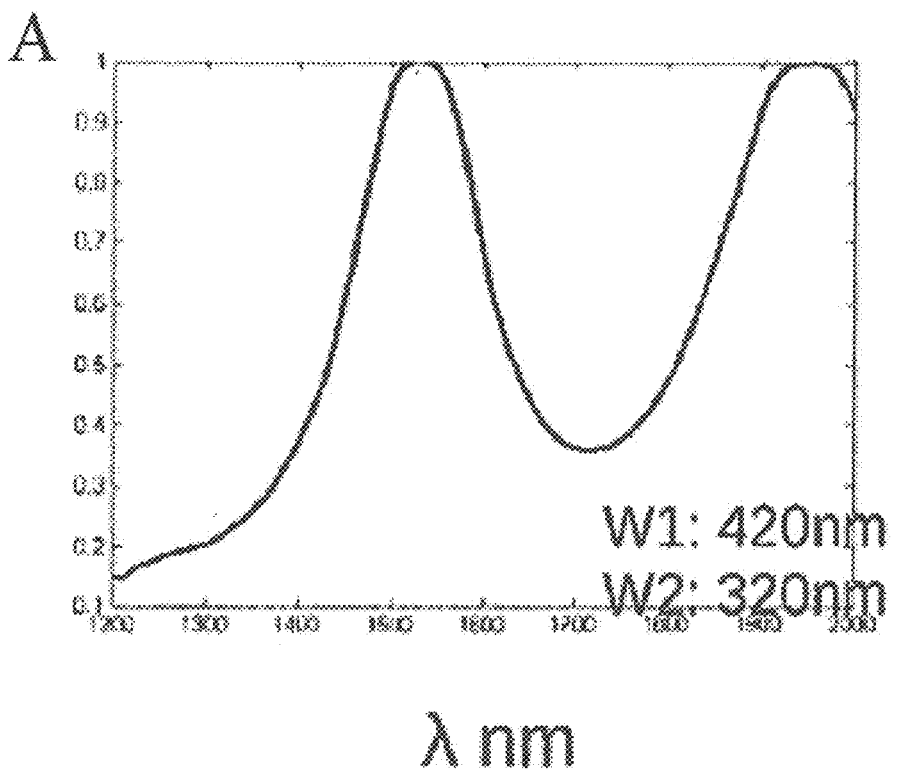
FIG. 19 is a diagram representing the absorption spectrum of a rectenna device having an array of a plurality of metallic patches of different lateral dimensions, according to some embodiments of the invention.

FIGS. 18 and 19 show the absorption spectra of a rectenna device 400 having an array of a plurality of metallic patches 410 having different widths, according to some embodiments. In FIG. 18, the metallic patches 410 may comprise a metallic patch 410 having a width of 260 nm and a metallic patch 410 having a width of 320 nm. The metallic patches 410 may be arranged with a periodic spacing P of 850 nm along the array. In FIG. 19, the metallic patches 410 may comprise a metallic patch 410 having a width of 320 nm and a metallic patch 410 having a width of 420 nm. The metallic patches 410 may be arranged with a periodic spacing P of 850 nm.

FIGS. 18 and 19 show that a plurality of operating wavelengths can be detected or harvested using a simple geometry. The number of operating wavelengths that can be harvested may depend on the designed array structure.

In the embodiment of FIG. 18, the rectenna device 400 may resonate at 1350 nm and 1525 nm.

In the embodiment of FIG. 19, the rectenna device 400 may resonate at 1550 nm and 1950 nm.

Figure 20:
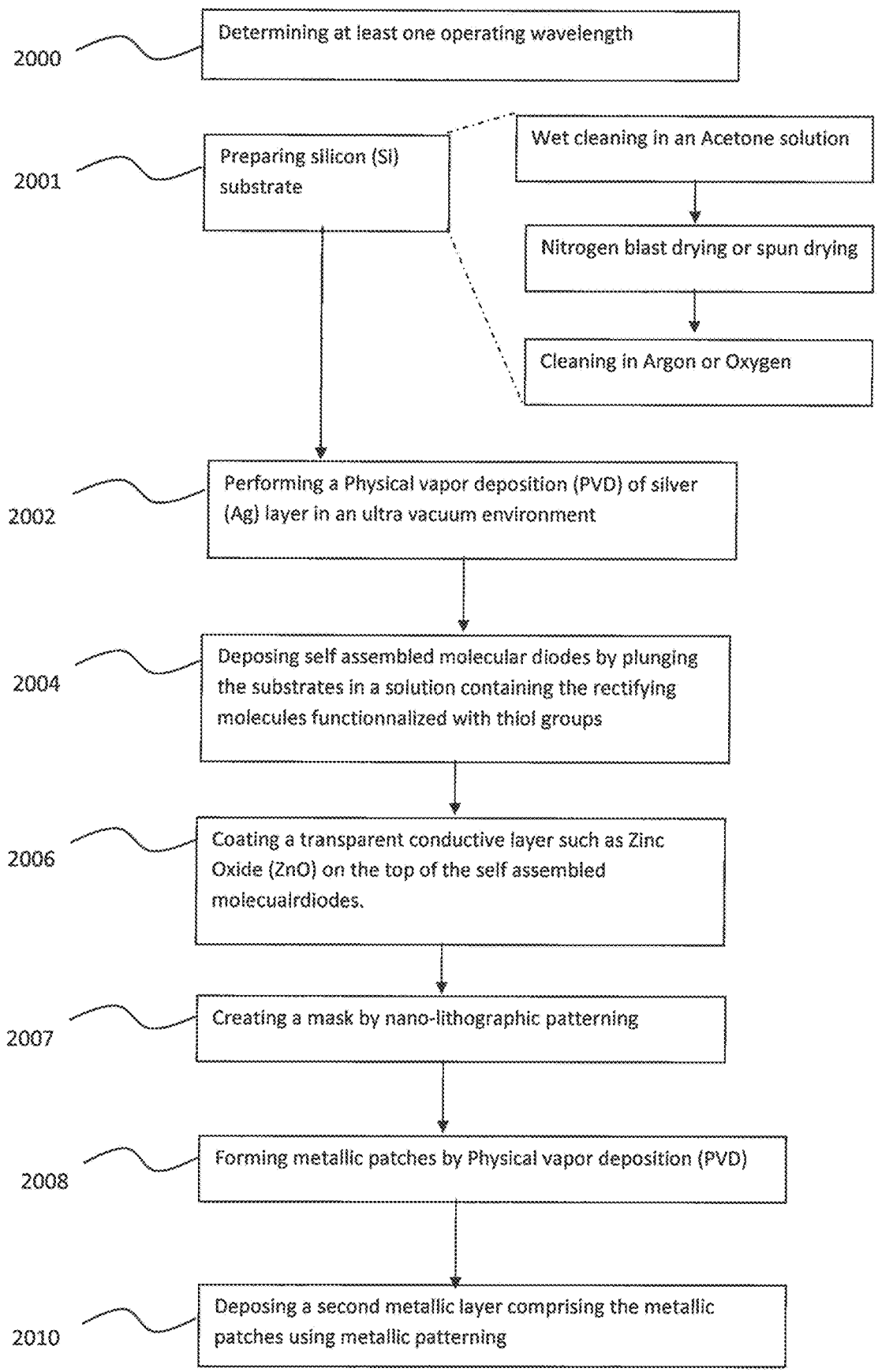
FIG. 20 is a flowchart illustrating the process of manufacturing a rectenna device, according to some embodiments of the invention.

FIG. 20 is a flowchart depicting a method for manufacturing a multi-layer rectenna device 400 based on one or more molecular diodes, in some embodiments of the invention.

At step 2000, at least one operating wavelength may be determined.

At step 2001, the substrate on which the rectenna device is to be made may be previously cleaned. The cleaning technique applied at step 2001 may vary depending on the type of substrate.

In a preferred embodiment of the invention, the substrate may be formed from silicon (Si). The following description of some embodiments of the invention will be made with reference to manufacturing of a layered rectenna structure using a silicon substrate, for illustrative purposes only. However, the skilled person will readily understand that the invention is not limited to a silicon substrate.

In such embodiment, the silicon (Si) substrate may be first wet cleaned in an acetone solution followed by nitrogen blast drying or spun drying. Further the substrate may be plasma cleaned in argon or oxygen to remove organic impurities that could be present in the substrate surface.

At step 2002, a physical vapor deposition (PVD) of a silver layer may be performed, in an ultra vacuum environment.

At step 2004, a molecular diode may be deposited.

At step 2006, a spin coating of Zinc oxide (ZnO) particles may be performed. The skilled person will readily understand that the deposition of the conductive layer is not limited to spin coating. Other deposition techniques may be used alternatively, such as PVD or Radio Frequency/Direct Current (RF/DC) sputtering.

At step 2007, a nano-lithographic patterning may be performed using a Polymethyl methacrylate (PMMA) layer. Such step creates the mask to deposit the metallic patches. The skilled person will readily understand that the material to be used for the mask is not limited to PMMA. Other types of lithography such as electron beam lithography or laser lithography may be used as well.

At step 2008, the metallic patches may be formed by PVD deposition of metal.

At step 2010, a final metallic pattern may be obtained by using a liftoff process of PMMA layer.

Direct patterning of the metal may be used as well.

Figure 21:
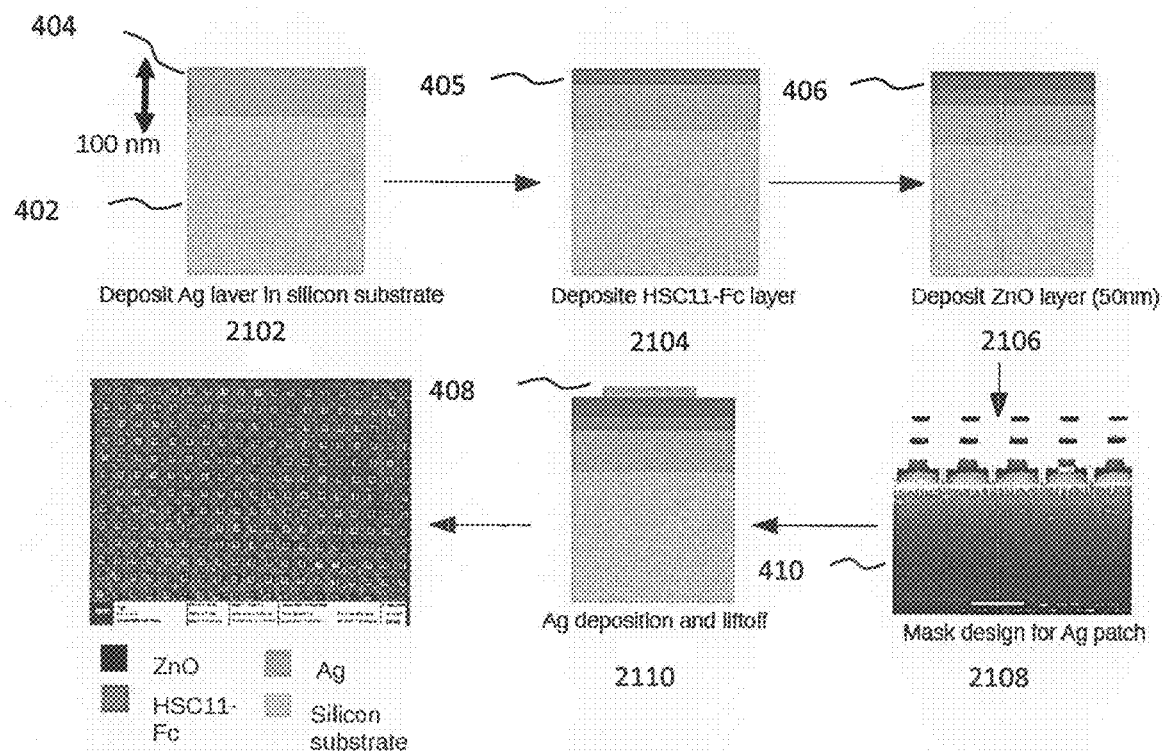
FIG. 21 depicts a metallic patch array obtained by the process of FIG. 20, according to some embodiments of the invention.

FIG. 21 shows a rectenna device 400 obtained with the manufacturing method according to the embodiment of FIG. 20.

At step 2102, the first silver (Ag) layer 404 having a thickness of 100 nm may be deposited on a silicon substrate 402.

Then, at step 2104, a HSC11-Fc layer 405 may be deposited on the top of the silver layer 404.

At step 2106, a ZnO layer 406 having a predefined thickness (such as a thickness of 50 nm) may be deposited on top of the layer 405.

At step 2108, a mask design may be performed for an array of silver (Ag) patches 410.

At step 2110, a metallic layer 408 comprising the array of silver patches 110 may be deposited according to a liftoff process.

In a preferred embodiment, the substrate 402, the first metallic layer 404 and the transparent conductive layer 406 may be planar in nature without any patterning.

In some embodiments, the first metallic layer 404 and the second metallic layer 408 may be coated using a suitable coating technique such as for example physical vapor deposition (PVD) of silver (Ag) layer in an ultra vacuum environment, magnetron sputtering, ion beam sputtering (IBS) and electron beam evaporation.

In some embodiments, the transparent conductive layer 406 may be coated using several techniques such as spin coating, deep coating, sol gel and evaporation.

The rectenna device 400 according to embodiments of the invention enables an efficient rectification behavior of the rectifying layer 405.

Figure 22:
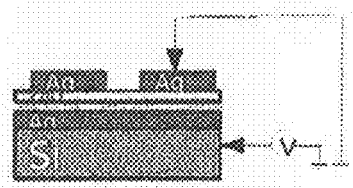
FIG. 22 is a diagram representing an experimental arrangement and a measurement sequence related to the rectification behavior of the organic layer of the rectenna device, according to an exemplary embodiment.
Figure 22:
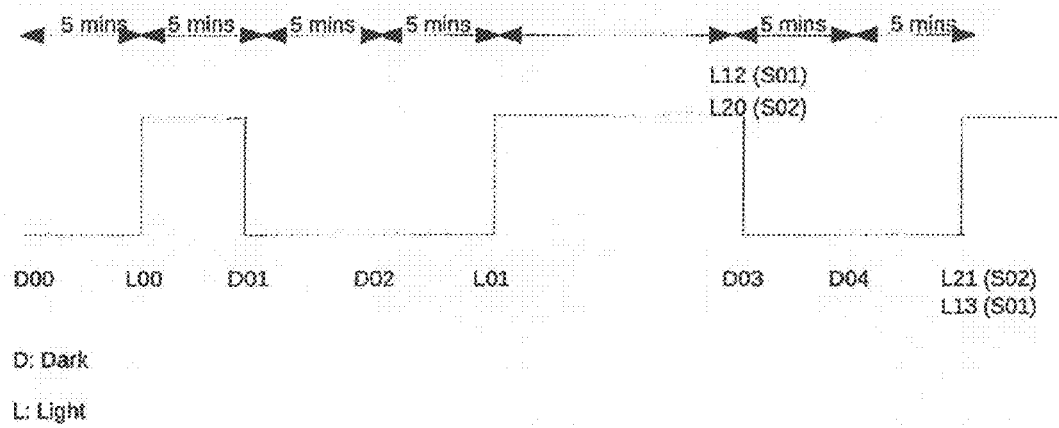

With reference to FIG. 22, there is shown an experimental arrangement and a measurement sequence applied to analyze the rectification behavior of an organic layer consisting on a Self-Assembled Monolayer (SAM), according to some embodiments. The measurement sequence of FIG. 22 comprises:

measuring dark current versus voltage (I(V) curve (D00),
turning on light at a wavelength of 1550 nm and measuring IV curve (L00),
keeping light on for 5 minutes and then turning off, measuring dark IV (D01),
waiting for 5 minutes to measure next dark IV curve (D02),
waiting for 5 minutes to turn on light and measure IV curve (L01),
repeating IV measurement for a number of cycles,
turning off the light and measuring dark IV (D03),
waiting for 5 minutes and measuring dark IV (D04),
waiting for 5 minutes and then turning on light and measuring IV curves L13 or L21.

Such measurement sequence enables a characterization of the rectenna device 400 under dark and illumination and a characterization of the thermal effect.

Figure 23:
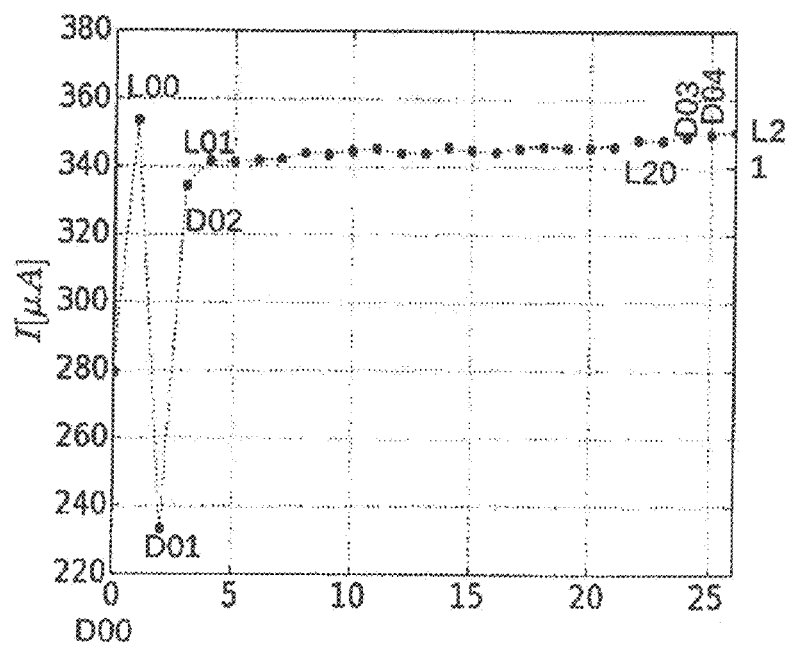
FIG. 23 is a diagram representing the current value generated by a rectenna device, according to an exemplary embodiment.

FIG. 23 depicts the current value obtained when the rectenna device 400 is alimented by a voltage of +1V, for the different steps of the measurement sequence shown in FIG. 22.

The IV curves, D00 and L00, depict the rectification of electromagnetic waves by the one or more molecular diodes comprised in the rectifying element 405. The other curves illustrate the measurement of performance.

Figure 24:
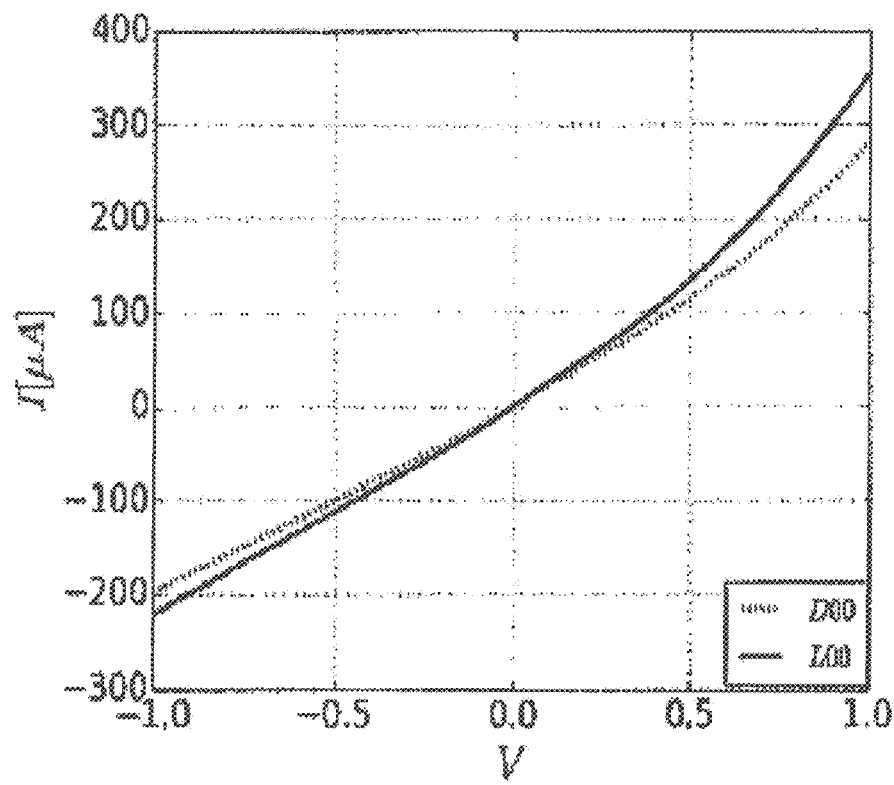
FIG. 24 is a diagram representing the evolution of the generated electrical current as a function of the voltage alimenting the rectenna device, and according to an embodiment.
Figure 24:
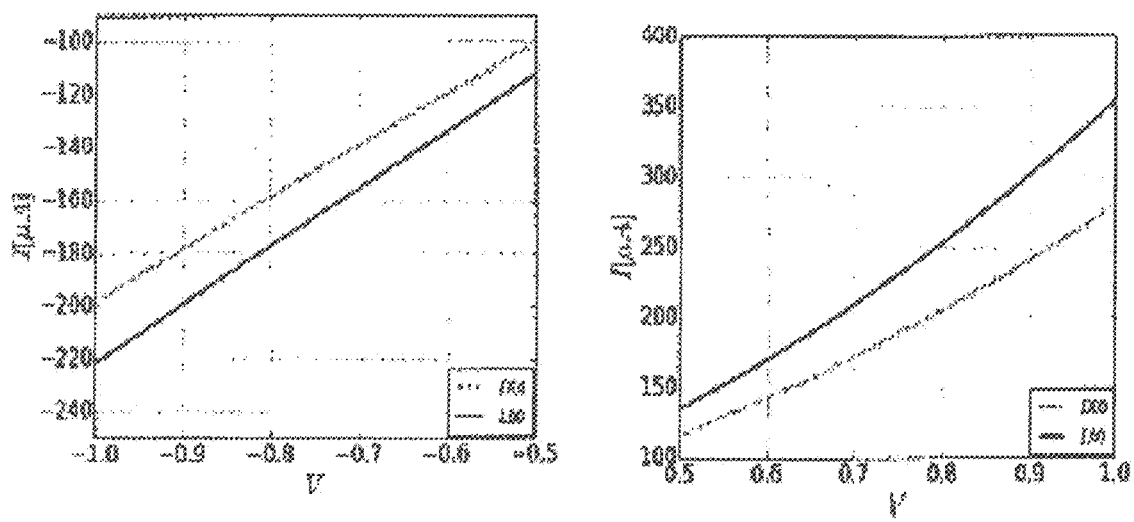

FIG. 24 shows the evolution of the generated electrical current as a function of the voltage alimenting the rectenna device 400, in some embodiments of the invention. The measurements of FIG. 24 show that the light is rectified by the rectenna array.

While the invention has been illustrated by a description of various embodiments and while these embodiments have been described in considerable detail, it is not the intention of the Applicant to restrict or in any way limit the scope of the appended claims to such detail. Additional advantages and modifications will readily appear to those skilled in the art. Moreover, any of the flowcharts, sequence diagrams, and/or block diagrams may include more or fewer blocks than those illustrated consistent with embodiments of the invention.

The invention claimed is:

1. A rectenna device for converting incident light to electrical energy, wherein the rectenna device comprises:
a substrate;
a first metallic layer deposited on top of said substrate said first metallic layer having a predefined thickness;
a rectifying element deposited on top of said first metallic layer, the rectifying element being made of assembled rectifying molecules;
a second metallic layer deposited on top of said rectifying element and configured to collect electromagnetic waves of the incident light and to couple it into plasmonic waves within the rectenna device the second metallic layer comprising an array of a plurality of metallic patches spaced from each other according to a predefined spacing, each metallic patch having predefined dimensions,
wherein the rectifying element is configured to rectify the plasmonic waves to produce a direct current, the plasmonic waves being generated at one or more operating wavelengths, and at least one dimensioning parameter of the rectenna device is determined from at least one of said operating wavelengths, said at least one dimensioning parameter being chosen in a group comprising the dimensions of said plurality of metallic patches the spacing of the metallic patches in said array, and the predefined thickness of the first metallic layer.

2. The rectenna device of claim 1, wherein the plurality of metallic patches are arranged periodically along the array, the spacing of the plurality of metallic patches being constant across said array.

3. The rectenna device of claim 1, wherein the plurality of metallic patches are randomly arranged.

4. The rectenna device of claim 1, wherein the rectifying element comprises one or more self assembled molecular diodes, a molecular diode being functionalized with anchoring groups such as thiols (-SH) or nitriles (CN) or being chosen in a group comprising 11-(ferocenyl)-1-undecanthiol (HS-C11Fc), Styryl Pridinium, ferrocenyl-alkanedithiol, Styryl pyrridinium, porphyrines, phtalocyanines, and push pull molecules.

5. The rectenna device of claim 1, wherein said substrate is made of Silicon, the first metallic layer and/or said second metallic layer being formed from a material chosen in a group comprising Aluminum (Al), Silver (Ag), Gold (Au), Tungsten (W) or Copper (Cu).

6. The rectenna device of claim 1, wherein the at least one operating wavelength ranges from one time to one hundred times a total thickness, said total thickness representing the thickness of said first metallic layer.

7. The rectenna device of claim 1, wherein at least one operating wavelength is upper than one time the periodicity of said array.

8. The rectenna device of claim 1, wherein the plurality of metallic patches have a plurality of dimensions, the rectenna device operating at a plurality of operating wavelengths.

9. The rectenna device of claim 1, wherein the at least one operating wavelength is directly proportional to the length and/or the width of one metallic patch among said plurality of metallic patches with a proportionality constant.

10. The rectenna device of claim 1, wherein the rectenna device further comprises a transparent conductive layer deposited on top of the rectifying element the second metallic layer being deposited on top of the transparent conductive layer the transparent conductive layer having a predefined thickness and being configured to generate, for at least one operating wavelength, plasmonic waves from the electromagnetic waves at the vicinity of the rectifying element wherein the group in which said at least one dimensioning parameter is chosen further comprises the predefined thickness of the transparent conductive layer.

11. The rectenna device of claim 10, wherein at least one operating wavelength ranges from one time to one hundred times a total thickness, said total thickness representing the sum of the thickness of said first metallic layer and of the thickness of said transparent conductive layer.

12. The rectenna device of claim 11, wherein the transparent conductive layer is chosen in said first group and said total thickness is up to 50 nm.

13. The rectenna device of claim 11, wherein the transparent conductive layer is chosen in said second group and said total thickness is higher than 50 nm.

14. The rectenna device of claim 10, wherein said transparent conductive layer is chosen in a first group comprising ZnO or ZnS, or in a second group comprising ZnO:Al, ITO, PEDOT:PSS, and silver nano-particles.

15. A method of manufacturing a rectenna device for converting incident light to electrical energy, the method comprising:
 determining at least one operating wavelength at which said rectenna device resonates;
 preparing a substrate, comprising cleaning and coating operations;
 depositing a first metallic layer on top of said substrate;
 depositing a rectifying element on top said first metallic layer, the rectifying element having a predefined thickness and being configured to rectify plasmonic waves generated by the rectenna device from the electromagnetic waves of the incident light at the vicinity of the rectifying element;
 depositing a second metallic layer on top of the rectifying element, which provides an array of a plurality of metallic patches having each predefined dimensions and being spaced from each other according to a predefined spacing, wherein, the method further comprises:
 collecting electromagnetic waves of the incident light by said second metallic layer, and
 determining at least one dimensioning parameter of the rectenna device from at least one operating wavelength, said at least one dimensioning parameter being chosen in a group comprising the dimensions of said plurality of metallic patches, said spacing of the metallic patches, and the predefined thickness of said first metallic layer.

16. The method of claim 15, wherein said substrate and/or said rectifying element are planar layers without patterning.

17. The method of claim 15, wherein said substrate and said first and/or second metallic layers are obtained by using a technique chosen in a group comprising physical vapor deposition (PVD) of silver (Ag) layer in an ultra vacuum environment, magnetron sputtering, ion beam sputtering (IBS), electron beam evaporation and using colloidal nano-particles.

18. The method of claim 15, wherein the process further comprises:
 depositing a transparent conductive layer on top of the rectifying element, the transparent conductive layer having a predefined thickness, the second metallic layer being deposited at step on top of said transparent conductive layer, wherein said at least one dimensioning parameter being chosen in said group further comprising the predefined thickness of the transparent conductive layer.

19. The method of claim 15, wherein the substrate, the rectifying element and the transparent conductive layer are planar layers without patterning.

20. The method of claim 19, wherein the transparent conductive layer is obtained by using a technique chosen in a group comprising spin coating, deep coating, sol gel or evaporation.

* * * * *